(12) United States Patent
Yu et al.

(10) Patent No.: US 11,809,000 B2
(45) Date of Patent: Nov. 7, 2023

(54) PHOTONIC INTEGRATED CIRCUIT AND PACKAGE STRUCTURE

(71) Applicant: Taiwan Semiconductor Manufacturing Company, Ltd., Hsinchu (TW)

(72) Inventors: Tsung-Yuan Yu, Taipei (TW); Hung-Yi Kuo, Taipei (TW); Cheng-Chieh Hsieh, Tainan (TW); Hao-Yi Tsai, Hsinchu (TW); Chung-Ming Weng, Hsinchu (TW); Hua-Kuei Lin, Hsinchu (TW); Che-Hsiang Hsu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 125 days.

(21) Appl. No.: 17/206,130

(22) Filed: Mar. 19, 2021

(65) Prior Publication Data

US 2022/0299719 A1 Sep. 22, 2022

(51) Int. Cl.
G02B 6/12 (2006.01)
G02B 6/42 (2006.01)
H01L 23/00 (2006.01)
H01L 25/16 (2023.01)

(52) U.S. Cl.
CPC ....... *G02B 6/4251* (2013.01); *G02B 6/12002* (2013.01); *G02B 6/12004* (2013.01); *H01L 25/167* (2013.01); *G02B 6/12* (2013.01); *G02B 2006/121* (2013.01); *G02B 2006/12061* (2013.01); *H01L 23/562* (2013.01)

(58) Field of Classification Search
CPC ...... G02B 6/12004; G02B 6/122; G02B 6/12; G02B 2006/12061; G02B 6/12002; G02B 2006/121; H01L 23/562

See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,171,877 B2* | 10/2015 | Hirano | H01L 27/14627 |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2015/0097257 A1* | 4/2015 | Gambino | G02B 6/122 438/69 |
| 2017/0317116 A1* | 11/2017 | Celo | G02B 6/00 |
| 2020/0013771 A1* | 1/2020 | Maggi | G02B 6/12002 |
| 2020/0066656 A1* | 2/2020 | Polomoff | H01L 24/05 |
| 2020/0075435 A1* | 3/2020 | Chen | H01L 23/564 |

* cited by examiner

*Primary Examiner* — Michelle R Connelly
(74) *Attorney, Agent, or Firm* — JCIPRNET

(57) ABSTRACT

A photonic integrated circuit includes a substrate, an interconnection layer, and a plurality of silicon waveguides. The interconnection layer is over the substrate. The interconnection layer includes a seal ring structure and an interconnection structure surrounded by the seal ring structure. The seal ring structure has at least one recess from a top view. The recess concaves towards the interconnection structure. The silicon waveguides are embedded in the substrate.

20 Claims, 15 Drawing Sheets

PHOTONIC INTEGRATED CIRCUIT AND PACKAGE STRUCTURE

BACKGROUND

Integrated circuits are used in a variety of electronic applications, such as personal computers, cell phones, digital cameras, and other electronic equipment. Integrated circuits are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer and are singulated to be packaged at wafer level. Seal ring formation is an important part in the back-end of line semiconductor processes. Seal rings are stress protection structures of the integrated circuits to protect the internal circuit inside semiconductor chips from damages caused by dicing the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
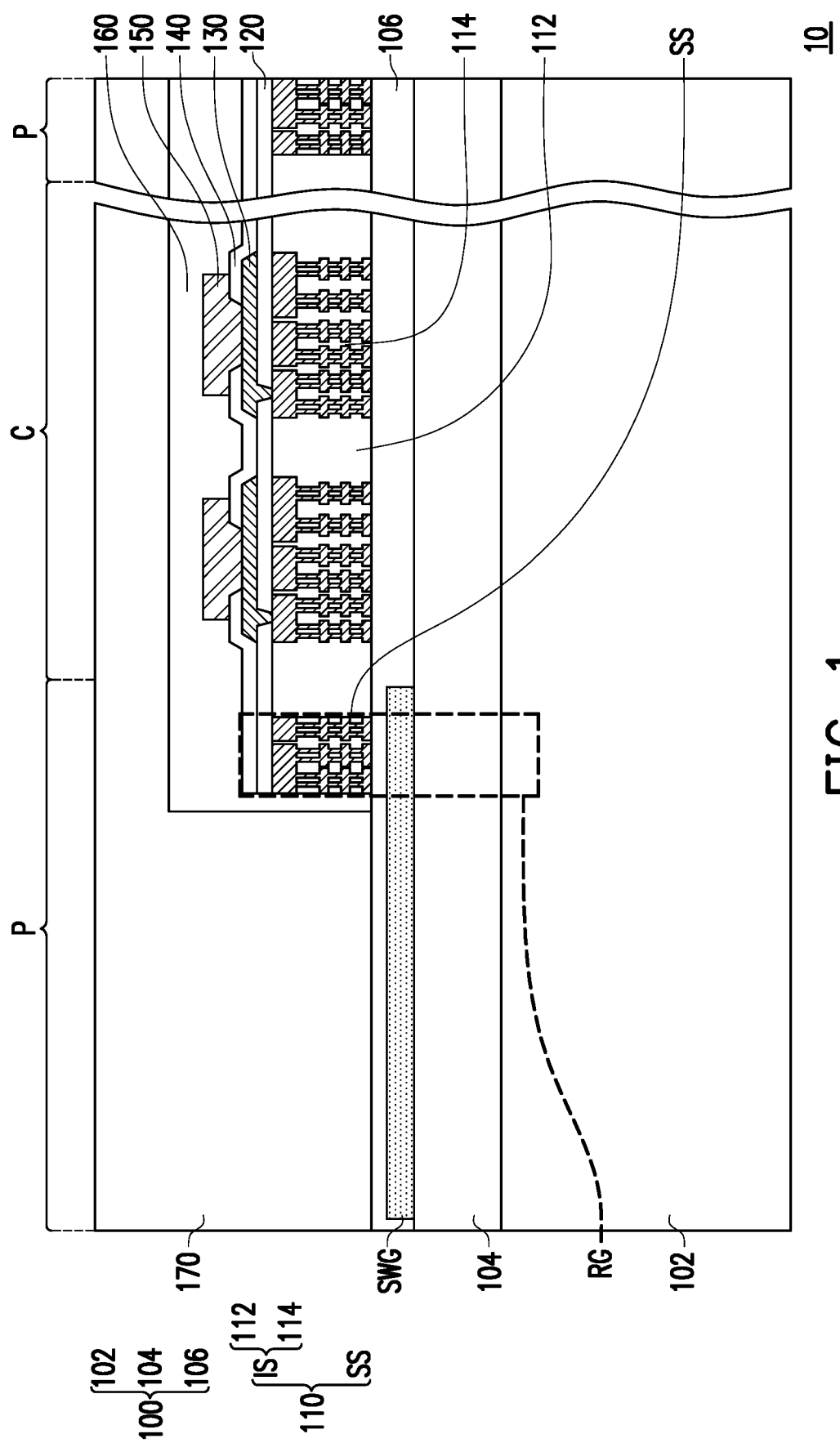
FIG. 1 is a schematic cross-sectional view illustrating a photonic integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a schematic cross-sectional view illustrating a photonic integrated circuit 10 in accordance with some embodiments of the present disclosure. Referring to FIG. 1, the photonic integrated circuit 10 includes a substrate 100, an interconnection layer 110, a plurality of silicon waveguides SWG, a dielectric layer 120, a plurality of conductive pads 130, a passivation layer 140, a plurality of conductive posts 150, a protection layer 160, and a sacrificial layer 170. In some embodiments, the photonic integrated circuit 10 includes a central region C and a peripheral regions P surrounding the central region C.

In some embodiments, the substrate 100 includes a base layer 102, an insulating layer 104, and a top layer 106 stacked in sequential order. In some embodiments, the base layer 102 is made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the insulating layer 104 is disposed on the substrate 100. In some embodiments, the insulating layer 104 is a silicon oxide layer, a silicon nitride layer, a titanium oxide layer, or the like. In some embodiments, the insulation layer 104 is formed by a chemical vapor deposition (CVD) process, a physical vapor deposition (PVD) process, an atomic layer deposition (ALD) process, a spin-on process, the like, or a combination thereof. In some embodiments, the insulating layer 104 is referred to as a "buried oxide (BOX) layer." In some embodiments, a material of the top layer 106 is the same as the material of the base layer 102. However, the disclosure is not limited thereto. In some alternative embodiments, the material of the top layer 106 may be different from the material of the base layer 102. In some embodiments, the top layer 106 is made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the top layer 106 is referred to as a "top silicon layer."

In some embodiments, the silicon waveguides SWG are embedded in the substrate 100. For example, the silicon waveguides SWG are embedded in the top layer 106 of the substrate 100. In some embodiments, the silicon waveguides SWG are formed by doping the top layer 106 with a p-type dopant or an n-type dopant. In some embodiments, the p-type dopant includes boron, $BF_2$, or the like. On the other hand, the n-type dopant includes phosphorus, arsenic, or the like. In some embodiments, the silicon waveguides SWG are able to transmit optical signals along a lateral direction. For example, the silicon waveguides SWG may be referred to as "edge couplers." As illustrated in FIG. 1, the silicon waveguides SWG are buried within the top layer 106 and are not revealed. For example, the silicon waveguides SWG are coplanar with a bottom surface of the top layer 106. However, the disclosure is not limited thereto. In some alternative embodiments, the silicon waveguides SWG may be coplanar with a top surface of the top layer 106. In other words, the silicon waveguides SWG may be located on the top surface of the top layer 106 and are exposed by the top layer 106.

In some embodiments, since the substrate 100 includes the base layer 102, the insulating layer 104, and the top layer 106, the substrate 100 is referred to as a "semiconductor-on-insulator (SOI) substrate." In some embodiments, the substrate 100 has active components (e.g., transistors or the like) and passive components (e.g., resistors, capacitors, inductors, or the like) formed therein. In some embodiments, the substrate 100 further includes optical components (e.g., the silicon waveguide SWG, filters, or the like) formed therein.

In some embodiments, the interconnection layer 110 is formed over the substrate 100. In some embodiments, the interconnection layer 110 includes a seal ring structure SS and an interconnection structure IS. In some embodiments, the seal ring structure SS surrounds the interconnection structure IS. For example, the seal ring structure SS is located in the peripheral region P of the photonic integrated circuit 10 while the interconnection structure IS is located in the central region C of the photonic integrated circuit 10. In some embodiments, the interconnection structure IS is electrically connected to the active components and/or the passive components embedded in the substrate 100. As illustrated in FIG. 1, the silicon waveguide SWG is located underneath the seal ring structure SS. In other words, a vertical projection of the seal ring structure SS onto the base layer 102 is partially overlapped with the silicon waveguide SWG.

In some embodiments, the interconnection structure IS includes an inter-dielectric layer 112 and a plurality of patterned conductive layers 114. For simplicity, the inter-dielectric layer 112 is illustrated as a bulky layer in FIG. 1, but it should be understood that the inter-dielectric layer 112 may be constituted by multiple dielectric layers (shown in FIG. 2). The material and the formation method of the inter-dielectric layer 112 will be described later in conjunction with FIG. 2. In some embodiments, the patterned conductive layers 114 and the dielectric layers of the inter-dielectric layer 112 are stacked alternately. In some embodiments, two adjacent patterned conductive layers 114 are electrically connected to each other through conductive vias sandwiched therebetween.

In some embodiments, a material of the patterned conductive layers 114 includes aluminum, titanium, copper, nickel, tungsten, and/or alloys thereof. The patterned conductive layers 114 may be formed by electroplating, deposition, and/or photolithography and etching. It should be noted that the number of the patterned conductive layers 114 and the dielectric layers in the inter-dielectric layer 112 shown in FIG. 1 is merely an exemplary illustration, and the disclosure is not limited. In some alternative embodiments, the number of the patterned conductive layers 114 and the dielectric layers in the inter-dielectric layer 112 may be adjusted depending on the routing requirements.

In some embodiments, the seal ring structure SS includes multiple dielectric layers, multiple patterned conductive layers, and multiple conductive via layers. The detailed configuration of the seal ring structure SS will be described later in conjunction with FIG. 2, FIG. 3A, and FIG. 3B.

In some embodiments, the dielectric layer 120 is formed over the interconnection layer 110. In some embodiments, a material of the dielectric layer 120 includes polyimide, epoxy resin, acrylic resin, phenol resin, BCB, PBO, or any other suitable polymer-based dielectric material. The dielectric layer 120 may be formed by suitable fabrication techniques, such as spin-on coating, CVD, PECVD, or the like. In some embodiments, a plurality of openings is formed in the dielectric layer 120 to expose portions of the topmost patterned conductive layer 114. After the openings are formed, a plurality of conductive pads 130 is formed over the dielectric layer 120. For example, the conductive pads 130 are formed over the substrate 100 and the interconnection layer 110 such that the interconnection layer 110 is located between the substrate 100 and the conductive pads 130. In some embodiments, the locations of the conductive pads 130 correspond to the locations of the openings of the dielectric layer 120. For example, the conductive pads 130 extend into the openings of the dielectric layer 120 to render electrical connection between the conductive pads 130 and portions of the interconnection layer 110 (i.e. the patterned conductive layer 114 of the interconnection structure IS). In some embodiments, the conductive pads 130 are aluminum pads, copper pads, or other suitable metal pads. The number and the shape of the conductive pads 130 may be selected based on demand.

In some embodiments, after the conductive pads 130 are distributed over the dielectric layer 120, the passivation layer 140 is formed over the dielectric layer 120 and the conductive pads 130. In some embodiments, the passivation layer 140 has a plurality of contact openings which partially exposes the conductive pads 130. In some embodiments, the passivation layer 140 is a silicon oxide layer, a silicon nitride layer, a silicon oxy-nitride layer, or a dielectric layer formed by other suitable dielectric materials. The conductive pads 130 are partially exposed by the contact openings of the passivation layer 140. In some embodiments, an optional post-passivation layer (not shown) is form over the passivation layer 140.

In some embodiments, the conductive posts 150 are formed over the passivation layer 140 and the conductive pads 130. In some embodiments, the conductive posts 150 also fill the contact openings and are electrically connected to the conductive pads 130. The conductive posts 150 can be formed by suitable fabrication techniques. For example, the conductive posts 150 may be formed by the following steps. First, a patterned photoresist layer (not shown) is formed over the passivation layer 140. In some embodiments, the patterned photoresist layer is made of a photosensitive material. In some embodiments, the patterned photoresist layer has a plurality of openings partially exposing the passivation layer 140 above the conductive pads 130. Subsequently, a conductive material is deposited onto the exposed passivation layer 140 and the conductive pads 130 to form the conductive posts 150. The conductive material, for example, may be formed through a plating process. The plating process is, for example, an electro-plating process, an electroless-plating process, an immersion plating process, or the like. In some embodiments, the material of the conductive posts 150 is aluminum, titanium, copper, tungsten, and/or alloys thereof.

In some embodiments, the protection layer 160 is formed over the conductive layer 150 and the passivation layer 140. In some embodiments, the protection layer 160 completely encapsulates the interconnection layer 110, the dielectric layer 120, the conductive pads 130, the passivation layer 140, and the conductive posts 150. In some embodiments, a material of the protection layer 160 includes polyimide, epoxy resin, acrylic resin, phenol resin, BCB, PBO, or any other suitable polymer-based dielectric material. In some embodiments, the protection layer 160 may be formed by suitable fabrication techniques such as spin-on coating, CVD, PECVD, or the like.

In some embodiments, the sacrificial layer is 170 is formed over the protection layer 160. For example, the sacrificial layer 170 is formed to completely cover the protection layer 160. As illustrated in FIG. 1, the protection layer 160 exposes a portion of the substrate 100 and the sacrificial layer 170 covers the exposed portion of the substrate 100. In some embodiments, the sacrificial layer 170 is formed of a dielectric material such as a polymer, a polymer based photoresist, or a polyimide based photoresist. In some embodiments, the sacrificial layer 170 is deposited using an appropriate technique such as spin-on coating, CVD, PECVD, or the like. In some embodiments, after sacrificial layer 170 is deposited, it may be cured at an appropriate temperature. However, the disclosure is not limited thereto. In some alternative embodiments, the sacrificial layer 170 may be a laminated film. For example, the sacrificial layer 170 may be a base film attached to the substrate 100 and the protection layer 160 using an adhesive layer. The base film may be, for example, a polyethylene terephthalate (PET) base film, and the adhesive layer may be, for example, an ultraviolet (UV) or thermal activated release film.

As illustrated in FIG. 1, the seal ring structure SS is disposed near the edge of the interconnection layer 110. The relative configuration of the seal ring structure SS with respect to other elements in the photonic integrated circuit 10 will be described in detail below in conjunction with FIG. 2, FIG. 3A, and FIG. 3B.

Figure 2:
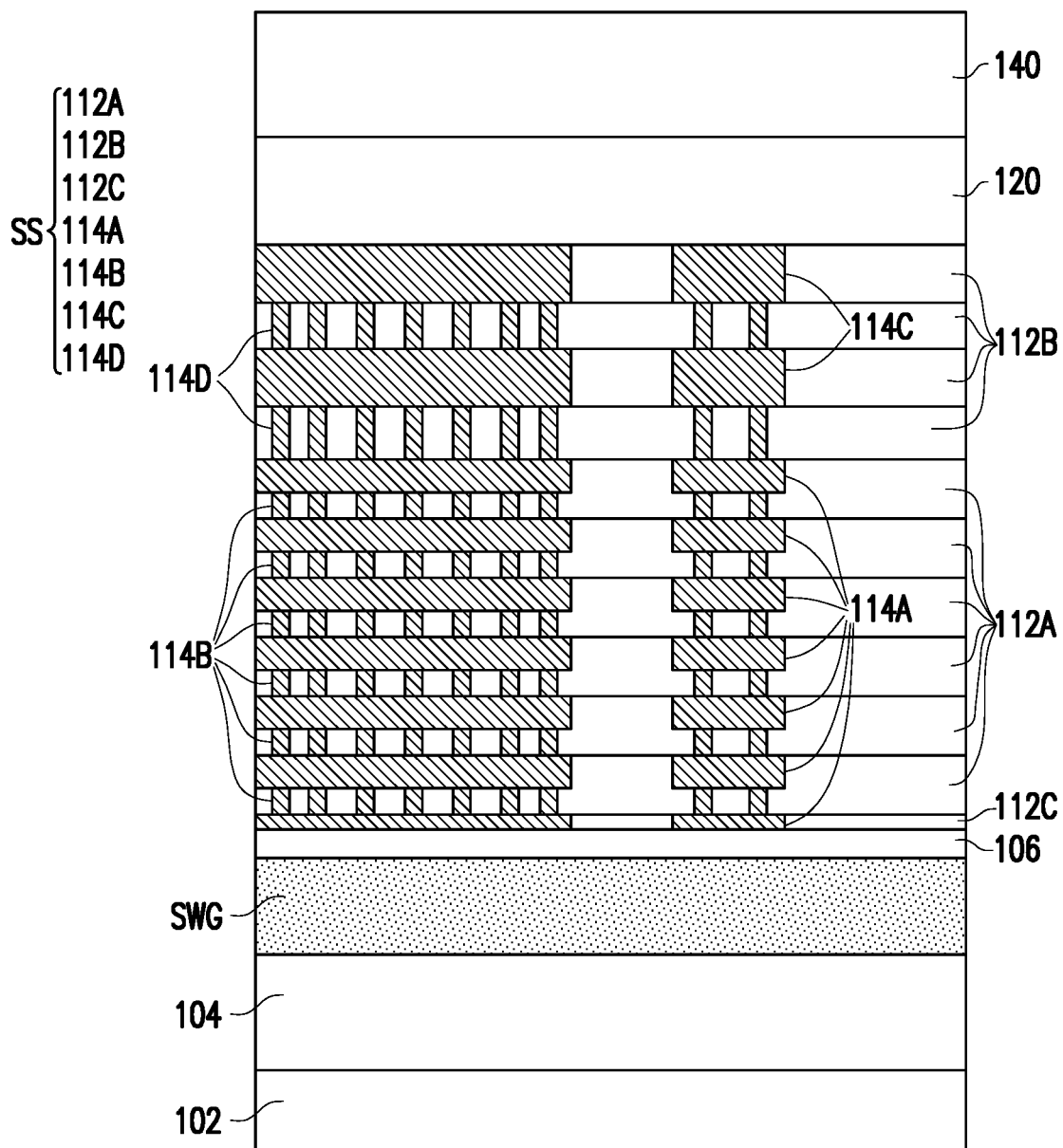
FIG. 2 is an enlarged schematic cross-sectional view illustrating a region of the photonic integrated circuit in FIG. 1.

FIG. 2 is an enlarged schematic cross-sectional view illustrating region RG of the photonic integrated circuit 10. In some embodiments, the seal ring structure SS is located on an inner side of a scribe line (not shown). During a die sawing operation, the photonic integrated circuits 10 are separated along the scribe line by e.g. laser cutting or blade, and the seal ring structure SS serves as an anti-stress mechanism to prevent cracking or delamination of the elements within the photonic integrated circuit 10.

In some embodiments, the seal ring structure SS includes dielectric layers 112A, dielectric layers 112B, a dielectric layer 112C, patterned conductive layers 114A, patterned conductive layers 114C, conductive via layers 114B, and conductive via layers 114D. In some embodiments, the patterned conductive layers 114A and the conductive via layers 114B are embedded within the dielectric layers 112A and the dielectric layer 112C. In some embodiments, the patterned conductive layers 114A and the dielectric layers 112A/the dielectric layer 112C are stacked alternately. On the other hand, the conductive via layers 114B penetrate through the dielectric layers 112A to physically connect the adjacent patterned conductive layers 114A. In some embodiments, the dielectric layers 112A are provided over the dielectric layer 112C.

In some embodiments, the dielectric layers 112A and the dielectric layer 112C are low k dielectric layers. The dielectric constants (k values) of low-k dielectric layers may be e.g. lower than 3.0, or even lower than about 2.5, hence are also referred to as extreme low-k (ELK) dielectric layers. The material for the dielectric layers 112A and the dielectric layer 112C may include organic dielectric material such as organic silicate glass (OSG), porous methyl silsesquioxane (p-MSQ), hydrogen silsesquioxane (HSQ), a combination thereof, or any other suitable organic low k or extreme low k material. Alternatively, the material for the dielectric layers 112A and the dielectric layer 112C may include inorganic dielectric material such as carbon-doped silicon oxide, fluorine-doped silicate glass (FSG), a combination thereof, or any other suitable inorganic low k or extreme low k material. Moreover, other suitable dielectric materials, such as silicon oxide or phosphosilicate glass (PSG) may be also used for the dielectric layers 112A and the dielectric layer 112C.

In some embodiments, the bottommost layer of the patterned conductive layers 114A may be formed using a single damascene operation. By way of example, the dielectric layer 112C is patterned by photolithography and etching operations to form trench openings, and then a metallization operation, such as a metallic CVD operation or an electro-plating operation is performed to fill the trench openings of the dielectric layer 112C to form the bottommost layer of the patterned conductive layers 114A. In some embodiments, a planarization operation (such as a chemical mechanical polishing (CMP) operation) is performed to remove excessive conductive material outside the trench openings, and thus to provide an even surface for the successive fabrication. In some embodiments, upper metal layers of the patterned conductive layers 114A may be formed along with the underlying conductive via layers 114B using a dual damascene operation. By way of example, the dielectric layers 112A are patterned by photolithography and etching operations to form via openings and trench openings, where the dimension of trench opening is larger than that of via opening. Then, a metallization operation, such as a metallic CVD operation or an electroplating operation is performed to fill the via openings and trench openings of the dielectric layers 112A to form the remaining patterned conductive layers 114A. In some embodiments, a planarization operation (such as CMP operation) is performed to remove excessive conductive material outside the trench openings, and thus to provide an even surface for the successive fabrication. In some embodiments, the patterned conductive layers 114A and the conductive via layers 114B are formed of various conductive materials including metallic materials e.g. copper, aluminum, tungsten, cobalt, an alloy thereof, or other suitable conductive materials.

In some embodiments, the dielectric layers 112B are formed over the dielectric layers 112A. In other words, the dielectric layers 112A are located between the dielectric layers 112B and the dielectric layer 112C. The dielectric layers 112B may be made of un-doped silicate glass (USG) or other suitable dielectric materials. The dielectric layers 112B are configured to improve mechanical property and prevent moisture penetration. The conductive patterned layers 114C and the conductive via layers 114D underlying the patterned conductive layers 114C are embedded in the dielectric layers 112B. In some embodiments, the material and the formation methods of the patterned conductive layers 114C and the conductive via layers 114D are respectively similar to that of the patterned conductive layers 114A and the conductive via layers 114B, so the detailed descriptions thereof are omitted herein. However, the patterned conductive layers 114C have larger line width and larger thickness than the patterned conductive layers 114A.

In some embodiments, the dielectric layers 112A, the dielectric layers 112B, and the dielectric layer 112C shown in FIG. 2 constitute the inter-dielectric layer 112 in FIG. 1. In some embodiments, the seal ring structure SS located in the peripheral region P is formed concurrently with the interconnection structure IS located in the central region C. That is, the patterned conductive layers 114A, the patterned conductive layers 114C, the conductive via layers 114B, and the conductive via layers 114D of the seal ring structure SS and the patterned conductive layers 114 and the underlying conductive vias of the interconnection structure IS are formed simultaneously. In some embodiments, the seal ring structure SS is electrically floating. In other words, the seal ring structure SS is electrically isolated from other components within the photonic integrated circuit 10. In FIG. 2, the seal ring structure SS with nine-layered stacked structure is illustrated as an example, but the number of the stacked layers could be modified based on design.

Figure 3A:
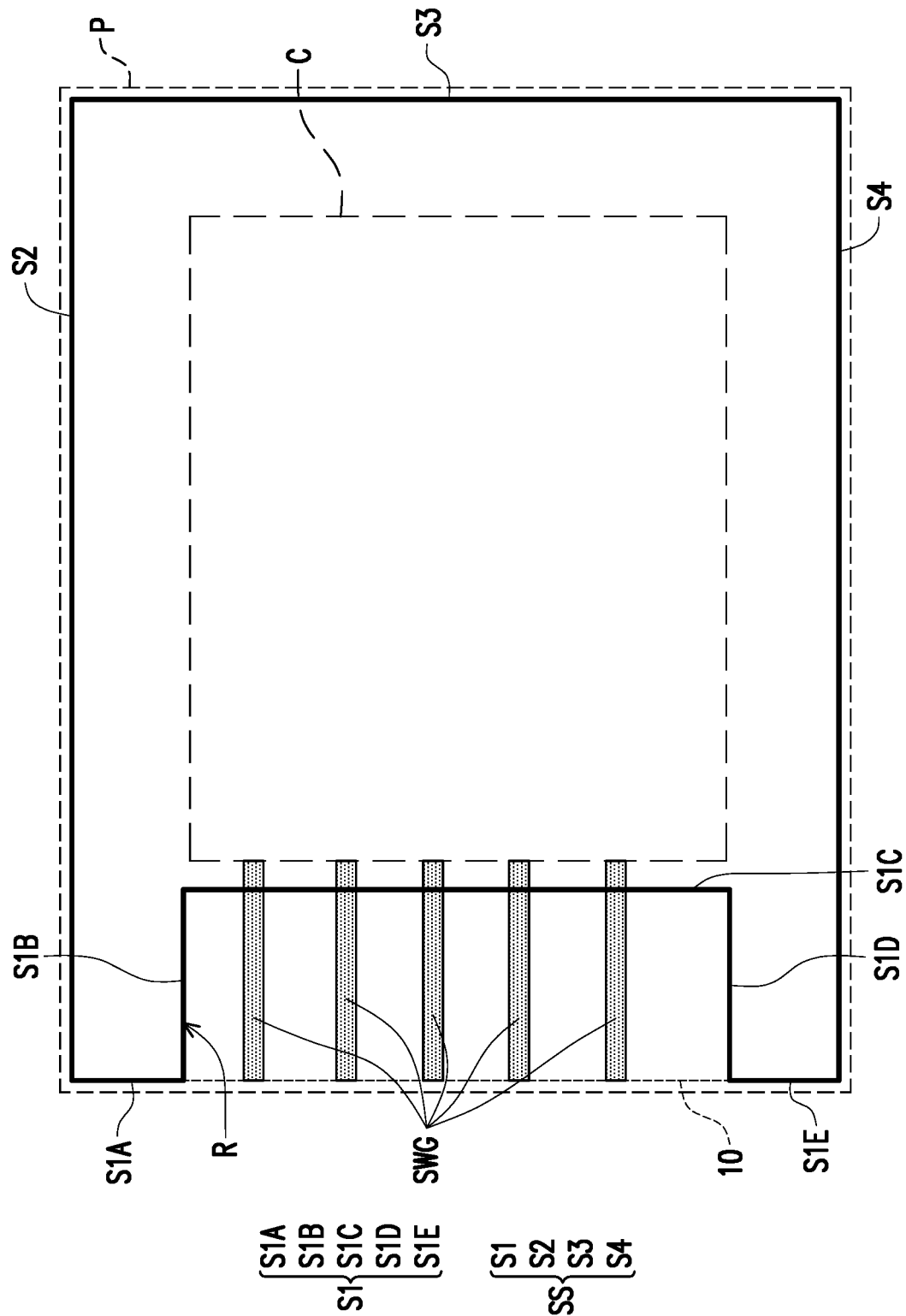
FIG. 3A is a schematic top view illustrating the photonic integrated circuit in FIG. 1.

FIG. 3A is a schematic top view illustrating the photonic integrated circuit 10 in FIG. 1. It should be noted that for simplicity, elements other than the seal ring structure SS and the silicon waveguide SWG are omitted in the top view of FIG. 3. Referring to FIG. 3A, the seal ring structure SS has a recess R from the top view. In some embodiments, the recess R concaves towards the central region C of the photonic integrated circuit 10. As mentioned above, the interconnection structure IS is located in the central region C of the photonic integrated circuit 10. As such, the recess R of the seal ring structure R concaves towards the interconnection structure IS.

In some embodiments, the seal ring structure SS is divided into a first segment S1, a second segment S2, a third segment S3, and a fourth segment S4. The third segment S3 is connected to the second segment S2 and the fourth segment S4, and the second segment S2 and the third segment S3 are connected to the first segment S1. As illustrated in FIG. 3A, the second segment S2, the third segment S3, and the fourth segment S4 respectively extend along three edges of the photonic integrated circuit 10. For example, when the photonic integrated circuit 10 is quadrilateral from the top view, the second segment S2 is parallel to the fourth segment S4, and the third segment S3 is perpendicular to both the second segment S2 and the fourth segment S4.

In some embodiments, the first segment S1 is further divided into a first sub-segment S1A, a second sub-segment S1B, a third sub-segment S1C, a fourth sub-segment S1D, and a fifth sub-segment S1E. The first sub-segment S1A connects the second segment S2 and the second sub-segment S1B, the second sub-segment S1B connects the first sub-segment S1A and the third sub-segment S1C, the third sub-segment S1C connects the second sub-segment S1B and the fourth sub-segment S1D, the fourth sub-segment S1D connects the third sub-segment S1C and the fifth sub-segment S1E, and the fifth sub-segment S1E connects the fourth sub-segment S1D and the fourth segment S4. As illustrated in FIG. 3A, the first sub-segment S1A and the fifth sub-segment S1E extend in the same direction along the same plane. The third sub-segment S1C extends in the same direction as the first sub-segment S1A and the fifth sub-segment S1E, but in a different plane. That is, the first sub-segment S1A, the third sub-segment S1C, and the fifth sub-segment S1E are parallel. In some embodiments, the first sub-segment S1A, the third sub-segment S1C, and the fifth sub-segment S1E are also parallel to the third segment S3. In some embodiments, the second sub-segment S1B is perpendicular to the first sub-segment S1A, the third sub-segment S1C, and the fifth sub-segment S1E. The fourth sub-segment S1D is also perpendicular to the first sub-segment S1A, the third sub-segment S1C and the fifth sub-segment S1E. In some embodiments, the second sub-segment S1B is parallel to the fourth sub-segment S1D. Moreover, the second sub-segment S1B and the fourth sub-segment S1D are parallel to the second segment S2 and the fourth segment S4.

As illustrated in FIG. 3A, at least a portion of each silicon waveguides SWG is located within the recess R. For example, the silicon waveguides SWG extend from inside of the enclosure of the seal ring structure SS to outside of the enclosure of the seal ring structure SS from the top view. As such, the silicon waveguides SWG intersect a portion of seal ring structure SS. For example, as illustrated in FIG. 3A, the silicon waveguides SWG are located underneath and intersect the third sub-segment S1C of the seal ring structure SS. In some embodiments, the silicon waveguides SWG are parallel to the second sub-segment S1B, the fourth sub-segment S1D, the second segment S2, and the fourth segment S4 from the top view. Meanwhile, the silicon waveguides SWG are perpendicular to the first sub-segment S1A, the third sub-segment S1C, the fifth sub-segment S1E, and the third segment S3.

In some embodiments, an area enclosed by the seal ring structure SS is approximately 80% to approximately 99% of a total area of a top surface of the photonic integrated circuit 10. Under this configuration, the seal ring structure SS is able to protect the photonic integrated circuit 10 from stress during sawing operation while enabling the silicon waveguides SWG to exchange optical signals with optical elements outside of the photonic integrated circuit 10 through edge-coupling.

It should be noted that the configuration of the seal ring structure SS shown in FIG. 3A is merely an exemplary illustration, and the disclosure is not limited thereto. Another configuration of the seal ring structure SS' will be described below in conjunction with FIG. 3B.

Figure 3B:
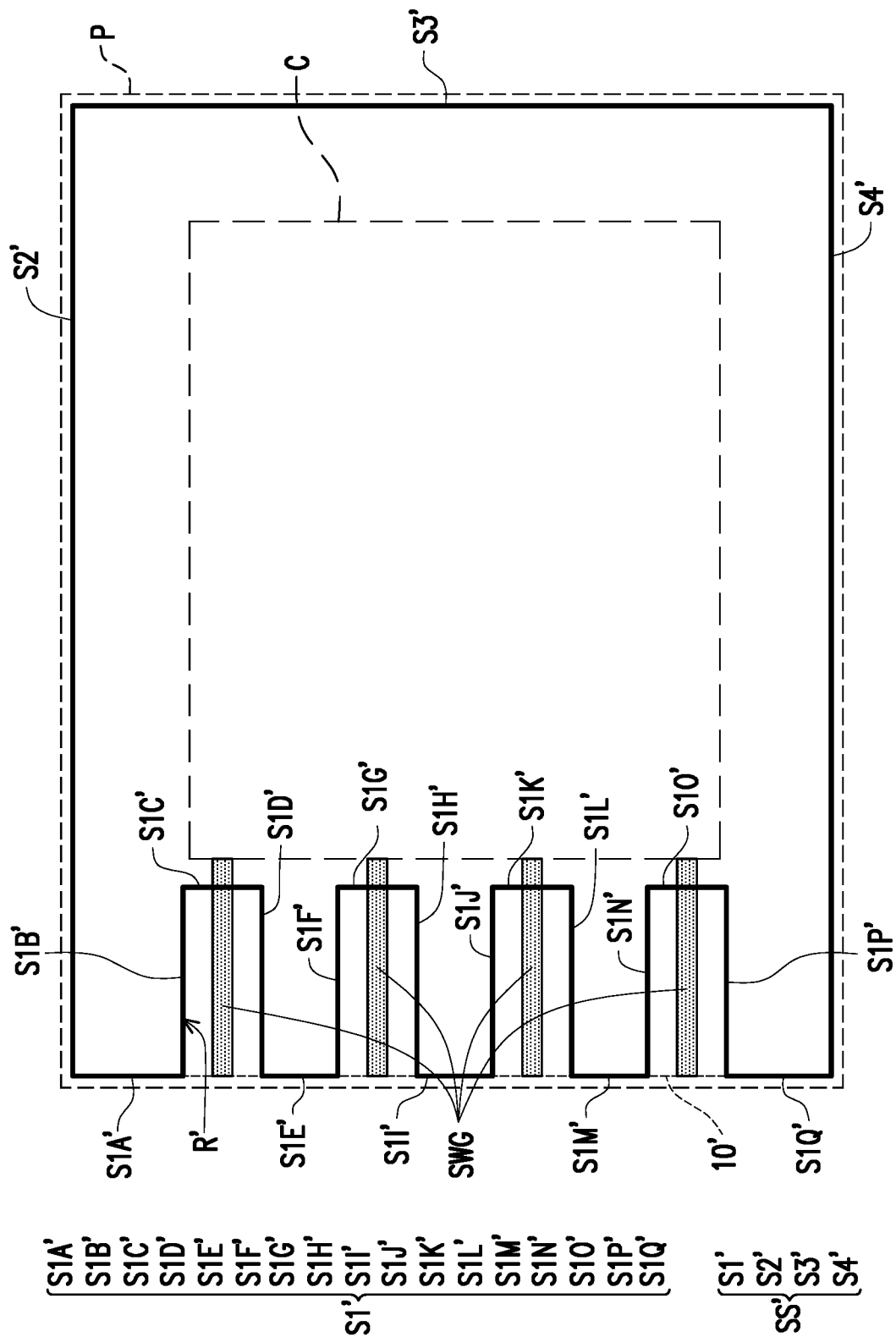
FIG. 3B is a schematic top view illustrating a photonic integrated circuit in accordance with some alternative embodiments of the disclosure.

FIG. 3B is a schematic top view illustrating a photonic integrated circuit 10' in accordance with some alternative embodiments of the disclosure. The photonic integrated circuit 10' and the seal ring structure SS' in FIG. 3B are respectively similar to the photonic integrated circuit 10 and the seal ring structure SS in FIG. 3A, so similar elements are denoted by similar reference numerals, and the detailed descriptions thereof are omitted herein. The difference between the photonic integrated circuit 10' in FIG. 3B and the photonic integrated circuit 10 in FIG. 3A lies in that the seal ring structure SS' includes a plurality of recesses R', whereas the seal ring structure SS has one single recess. For example, the seal ring structure SS' exhibits a comb shape on the top view. In FIG. 3B, four recesses R' are shown. However, the disclosure is not limited thereto. In some embodiments, the seal ring structure SS' may have fewer or more recesses.

In some embodiments, the seal ring structure SS' is divided into a first segment S1', a second segment S2', a third segment S3', and a fourth segment S4'. The third segment S3' is connected to the second segment S2' and the fourth segment S4', and the second segment S2' and the third segment S3' are connected to the first segment S1'. As illustrated in FIG. 3B, the second segment S2', the third segment S3', and the fourth segment S4' respectively extend along three edges of the photonic integrated circuit 10'. For example, when the photonic integrated circuit 10' is quadrilateral from the top view, the second segment S2' is parallel to the fourth segment S4', and the third segment S3' is perpendicular to both the second segment S2' and the fourth segment S4'.

In some embodiments, the first segment S1' is further divided into a first sub-segment S1A', a second sub-segment S1B', a third sub-segment S1C', a fourth sub-segment S1D', a fifth sub-segment S1E', a sixth sub-segment S1F', a seventh sub-segment S1G', an eighth sub-segment S1H', a ninth sub-segment S1I', a tenth sub-segment S1J', an eleventh sub-segment S1K', a twelfth sub-segment S1L', a thirteenth sub-segment S1M', a fourteenth sub-segment S1N', a fifteenth sub-segment S1O', a sixteenth sub-segment S1P', and a seventeenth sub-segment S1Q'. The first sub-segment S1A' connects the second segment S2' and the second sub-segment S1B', the second sub-segment S1B' connects the first sub-segment S1A' and the third sub-segment S1C', the third sub-segment S1C' connects the second sub-segment S1B' and the fourth sub-segment S1D', the fourth sub-segment S1D' connects the third sub-segment S1C' and the fifth sub-segment S1E', the fifth sub-segment S1E' connects the fourth sub-segment S1D' and the sixth sub-segment S1F', the sixth sub-segment S1F' connects the fifth sub-segment S1E' and the seventh sub-segment S1G', the seventh sub-segment S1G' connects the sixth sub-segment S1F' and the eighth sub-segment S1H', the eighth sub-segment S1H' connects the seventh sub-segment S1G' and the ninth sub-segment S1I', the ninth sub-segment S1I' connects the eighth sub-segment S1H' and the tenth sub-segment S1J', the tenth sub-segment S1J' connects the ninth sub-segment S1I' and the eleventh sub-segment S1K', the eleventh sub-segment S1K' connects the tenth sub-segment S1J' and the twelfth sub-segment S1L', the twelfth sub-segment S1L' connects the eleventh sub-segment S1K' and the thirteenth sub-segment S1M', the thirteenth sub-segment S1M' connects the twelfth sub-segment S1L' and the fourteenth sub-segment S1N', the fourteenth sub-segment S1N' connects the thirteenth sub-segment S1M' and the fifteenth sub-segment S1O', the fifteenth sub-segment S1O' connects the fourteenth sub-segment S1N' and the sixteenth sub-segment S1P', the sixteenth sub-segment S1P' connects the fifteenth sub-segment S1O' and the seventeenth sub-segment S1Q', and the seventeenth sub-segment S1Q' connects the sixteenth sub-segment S1P' and the fourth segment S4'. As illustrated in FIG. 3A, the first sub-segment S1A' the fifth sub-segment S1E', the ninth sub-segment S1I', the thirteenth sub-segment S1M', and the seventeenth sub-segment S1Q' extends in the same direction along the same plane. The third sub-segment S1C', the seventh sub-segment S1G', the eleventh sub-segment S1K', and the fifteenth sub-segment S1O' extends in the same direction as the first sub-segment S1A, the fifth sub-segment S1E, the ninth sub-segment S1I', the thirteenth sub-segment S1M', and the seventeenth sub-segment S1Q', but in a different plane. That is, the first sub-segment S1A', the third sub-segment S1C', the fifth sub-segment S1E', the seventh sub-segment S1G', the ninth sub-segment S1I', the eleventh sub-segment S1K', the thirteenth sub-segment S1M', the fifteenth sub-segment S1O', and the seventeenth sub-segment S1Q' are parallel. In some embodiments, the first sub-segment S1A', the third sub-segment S1C', the fifth sub-segment S1E, the seventh sub-segment S1G', the ninth sub-segment S1I', the eleventh sub-segment S1K', the thirteenth sub-segment S1M', the fifteenth sub-segment S1O', and the seventeenth sub-segment S1Q' are also parallel to the third segment S3'. In some embodiments, the second sub-segment S1B', the fourth sub-segment S1D', the sixth sub-segment S1F', the eight sub-segment S1H', the tenth sub-segment S1J', the twelfth sub-segment S1L', the fourteenth sub-segment S1N', and the sixteenth sub-segment S1P' are perpendicular to the first sub-segment S1A', the third sub-segment S1C', the fifth sub-segment S1E', the seventh sub-segment S1G', the ninth sub-segment S1I', the eleventh sub-segment S1K', the thirteenth sub-segment S1M', the fifteenth sub-segment S1O', and the seventeenth sub-segment S1Q'. In some embodiments, the second sub-segment S1B' is parallel to the fourth sub-segment S1D', the sixth sub-segment S1F', the eight sub-segment S1H', the tenth sub-segment S1J', the twelfth sub-segment S1L', the fourteenth sub-segment S1N', and the sixteenth sub-segment S1P'. Moreover, the second sub-segment S1B' and the fourth sub-segment S1D', the sixth sub-segment S1F', the eight sub-segment S1H', the tenth sub-segment S1J', the twelfth sub-segment S1L', the fourteenth sub-segment S1N', and the sixteenth sub-segment S1P' are parallel to the second segment S2' and the fourth segment S4'.

As illustrated in FIG. 3B, at least a portion of each silicon waveguides SWG is located within one of the recesses R'. That is, each recess R' accommodates one single silicon waveguide SWG from the top view. For example, the silicon waveguides SWG extend from inside of the enclosure of the seal ring structure SS' to outside of the enclosure of the seal ring structure SS' from the top view. As such, the silicon waveguides SWG intersect a portion of seal ring structure SS'. For example, as illustrated in FIG. 3B, the silicon waveguides SWG are located underneath and intersect the third sub-segment S1C', the seventh sub-segment S1G', the eleventh sub-segment S1K', and the fifteenth sub-segment S1O' of the seal ring structure SS'. In some embodiments, the silicon waveguides SWG are parallel to the second sub-segment S1B', the fourth sub-segment S1D', the sixth sub-segment S1F', the eighth sub-segment S1H', the tenth sub-segment S1J', the twelfth sub-segment S1L', the fourteenth sub-segment S1N', the sixteenth sub-segment S1P', the second segment S2', and the fourth segment S4' from the top view. Meanwhile, the silicon waveguides SWG are perpendicular to the first sub-segment S1A', the third sub-segment S1C', the fifth sub-segment S1E', the seventh sub-segment S1G', the ninth sub-segment S1I', the eleventh sub-segment S1K', the thirteenth sub-segment S1M', the fifteenth sub-segment S1O', the seventeenth sub-segment S1O', and the third segment S3'.

In some embodiments, an area enclosed by the seal ring structure SS' is approximately 80% to approximately 99% of a total area of a top surface of the photonic integrated circuit 10'. Under this configuration, the seal ring structure SS' is able to protect the photonic integrated circuit 10' from stress during sawing operation while enabling the silicon waveguides SWG to exchange optical signals with optical elements outside of the photonic integrated circuit 10' through edge-coupling.

In some embodiments, the integrated circuit 10 and the integrated circuit 10' shown in FIG. 1, FIG. 3A, and FIG. 3B can be packaged with other components to form package structures. The formation of these package structures will be described below.

FIG. 4A to FIG. 4I are schematic cross-sectional views illustrating various stages of the manufacturing method of a package structure PS in accordance with some embodiments of the disclosure. FIG. 5 is a schematic top view illustrating the package structure PS in FIG. 4I. It should be noted that the cross-sectional views of FIG. 4A to FIG. 4I is along the cross-sectional line A-A' shown in FIG. 5. As illustrated in FIG. 5, the package structure PS has a central region CR and a peripheral region PR surrounding the central region CR.

Figure 4A:
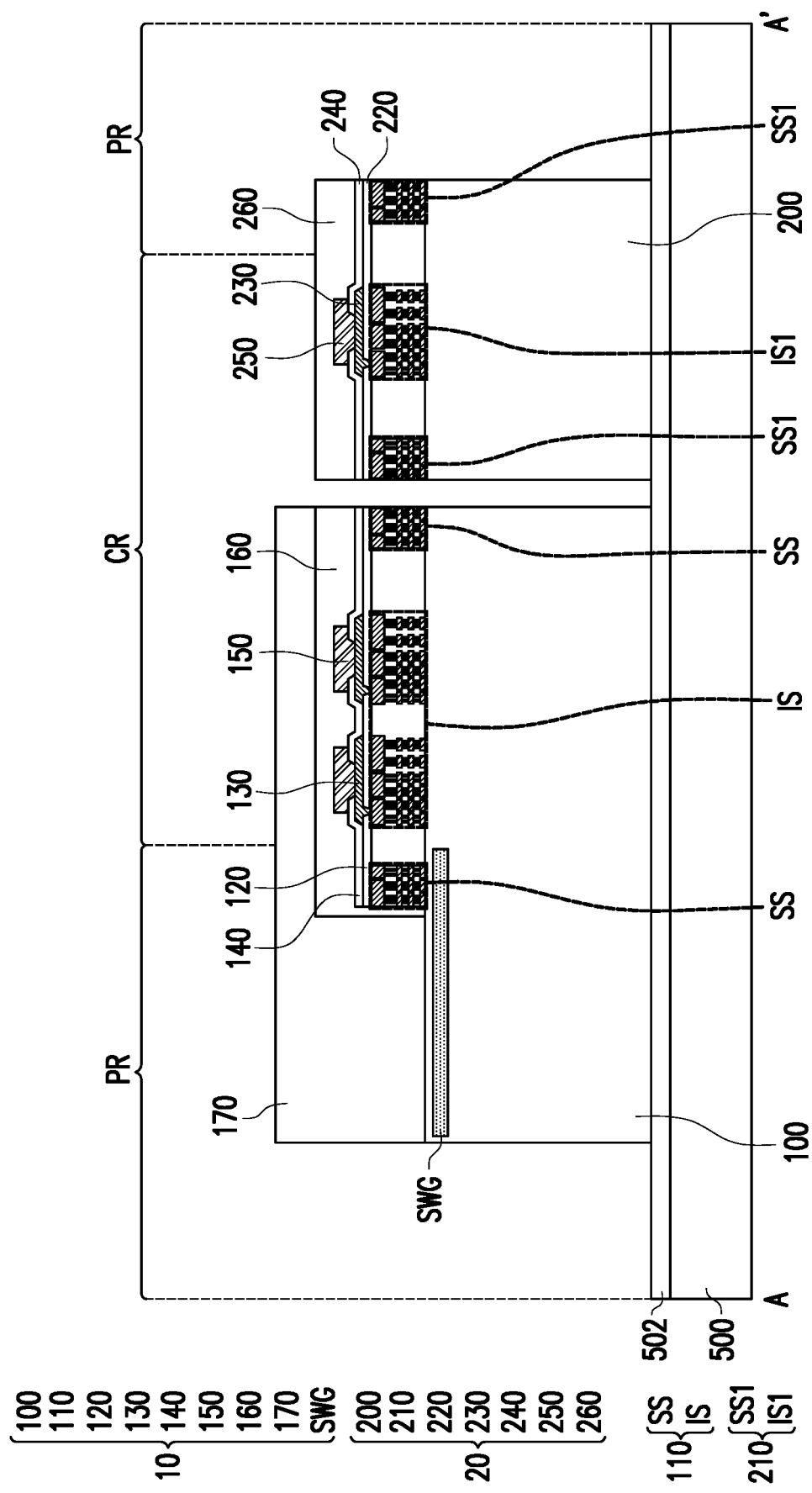
FIG. 4A to FIG. 4I are schematic cross-sectional views illustrating various stages of the manufacturing method of a package structure in accordance with some embodiments of the disclosure.
Figure 5:
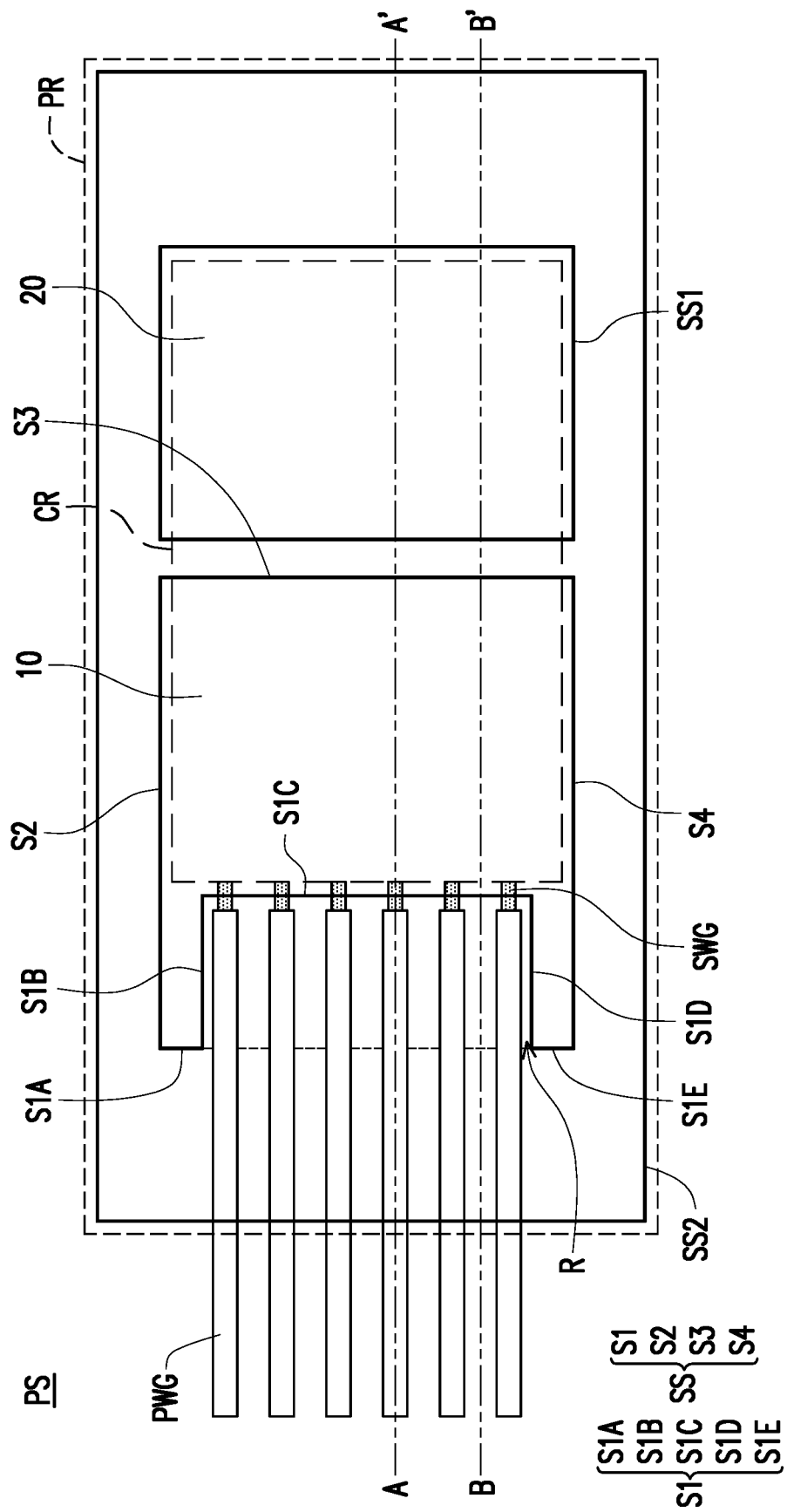
FIG. 5 is a schematic top view illustrating the package structure in FIG. 4I.

Referring to FIG. 4A, a carrier 500 is provided. Subsequently, a de-bonding layer (not shown) and an adhesive layer 502 are formed over the carrier 500 in sequential order. In some embodiments, the de-bonding layer is formed on an upper surface of the carrier 500 such that the de-bonding layer is between the carrier 500 and the adhesive layer 502. The carrier 500 is, for example, a glass substrate. On the other hand, the de-bonding layer is a light-to heat-conversion (LTHC) release layer formed on the glass substrate. In some embodiments, the adhesive layer 502 is, for example, die attachment film (DAF). However, the materials of the de-bonding layer, the carrier 500, and the adhesive layer 502 are merely for illustration, and the disclosure is not limited thereto. Other suitable materials may be used for the de-bonding layer, the carrier 500, and the adhesive layer 502.

In some embodiments, the photonic integrated circuit 10 in FIG. 1 and FIG. 3A is placed on the adhesive layer 502. In addition, an electric integrated circuit 20 is also placed on the adhesive layer 502. In some embodiments, the photonic integrated circuit 10 and the electric integrated circuit 20 are placed in a side-by-side manner. That is, the photonic integrated circuit 10 is adjacent to the electric integrated circuit 20. In some embodiments, the photonic integrated circuit 10 and the electric integrated circuit 20 are placed on the adhesive layer 502 by a picked-and-place process.

In some embodiments, the electric integrated circuit 20 includes a substrate 200, an interconnection layer 210, a dielectric layer 220, a plurality of conductive pads 230, a passivation layer 240, a plurality of conductive posts 250, and a protection layer 260. The substrate 200 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the substrate 200 includes active components (e.g., transistors or the like) and optionally passive components (e.g., resistors, capacitors, inductors or the like) formed therein. In some embodiments, the substrate 200 is free of optical components. In some embodiments, the interconnection layer 210 of the electric integrated circuit 20 is similar to the interconnection layer 110 of the photonic integrated circuit 10. That is, the interconnection layer 210 of the electric integrated circuit 20 also includes an interconnection structure IS1 and a seal ring structure SS1. In some embodiments, the interconnection structure IS1 in the electric integrated circuit 20 is similar to the interconnection structure IS in the photonic integrated circuit 10, so the detailed description thereof is omitted herein. However, the shape of the seal ring structure SS1 in the interconnection layer 210 of the electric integrated circuit 20 is different from the seal ring structure SS in the interconnection layer 110 of the photonic integrated circuit 10. For example, the seal ring structure SS1 of the electric integrated circuit 20 is quadrilateral from the top view. In other words, the seal ring structure SS1 of the electric integrated circuit 20 extend along four edges of the electric integrated circuit 20 from the top view (shown in FIG. 5). Similar to the seal ring structure SS of the photonic integrated circuit 10, the seal ring structure SS1 of the electric integrated circuit 20 is also electrically floating. The dielectric layer 220, the conductive pads 230, the passivation layer 240, the conductive posts 250, and the protection layer 260 of the electric integrated circuit 20 are respectively similar to the dielectric layer 120, the conductive pads 130, the passivation layer 140, the conductive posts 150, and the protection layer 160 of the photonic integrated circuit 10, so the detailed descriptions thereof are omitted herein.

It should be noted although FIG. 4A utilizes the photonic integrated circuit 10, the disclosure is not limited thereto. In some alternative embodiments, other types of photonic integrated circuit may be used in place on the photonic integrated circuit 10. For example, the photonic integrated circuit 10' in FIG. 3B may be used in place of the photonic integrated circuit 10.

Figure 4B:
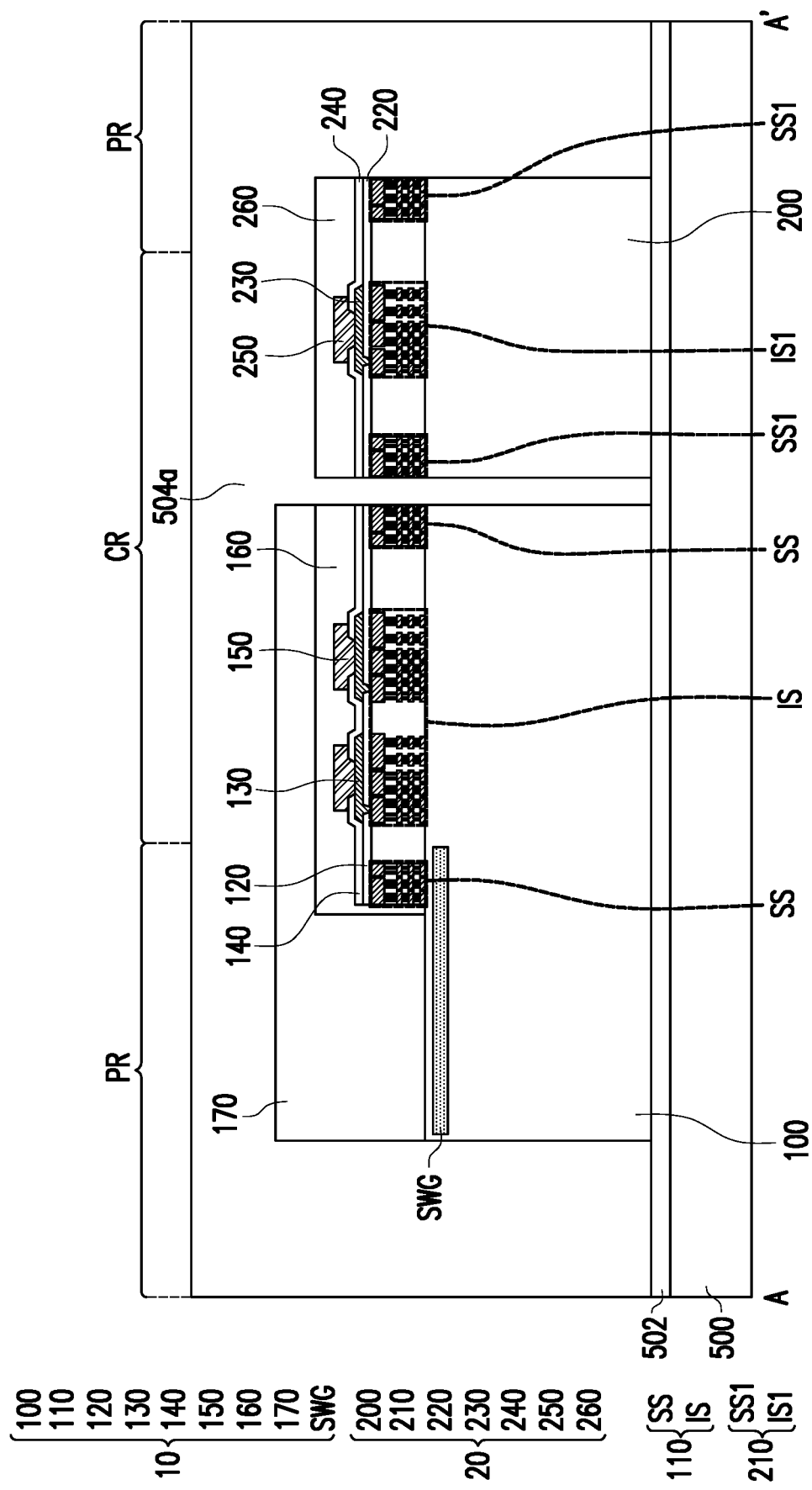

Referring to FIG. 4B, an insulating material 504a is formed on the adhesive layer 502 to encapsulate the photonic integrated circuit 10 and the electric integrated circuit 20. In some embodiments, the insulating material 504a is a molding compound, a molding underfill, a resin (such as epoxy), or the like. In some embodiments, the insulating material 504a includes fillers. The fillers may be particles made of silica, aluminum dioxide, or the like. In some embodiments, the insulating material 504a completely encapsulates the photonic integrated circuit 10 and the electric integrated circuit 20. That is, the sacrificial layer 170 of the photonic integrated circuit 10 and the protection layer 260 of the electric integrated circuit 20 are not revealed and are well protected by the insulating material 504a. The insulating material 504a may be formed by a molding process, such as a compression molding process.

Figure 4C:
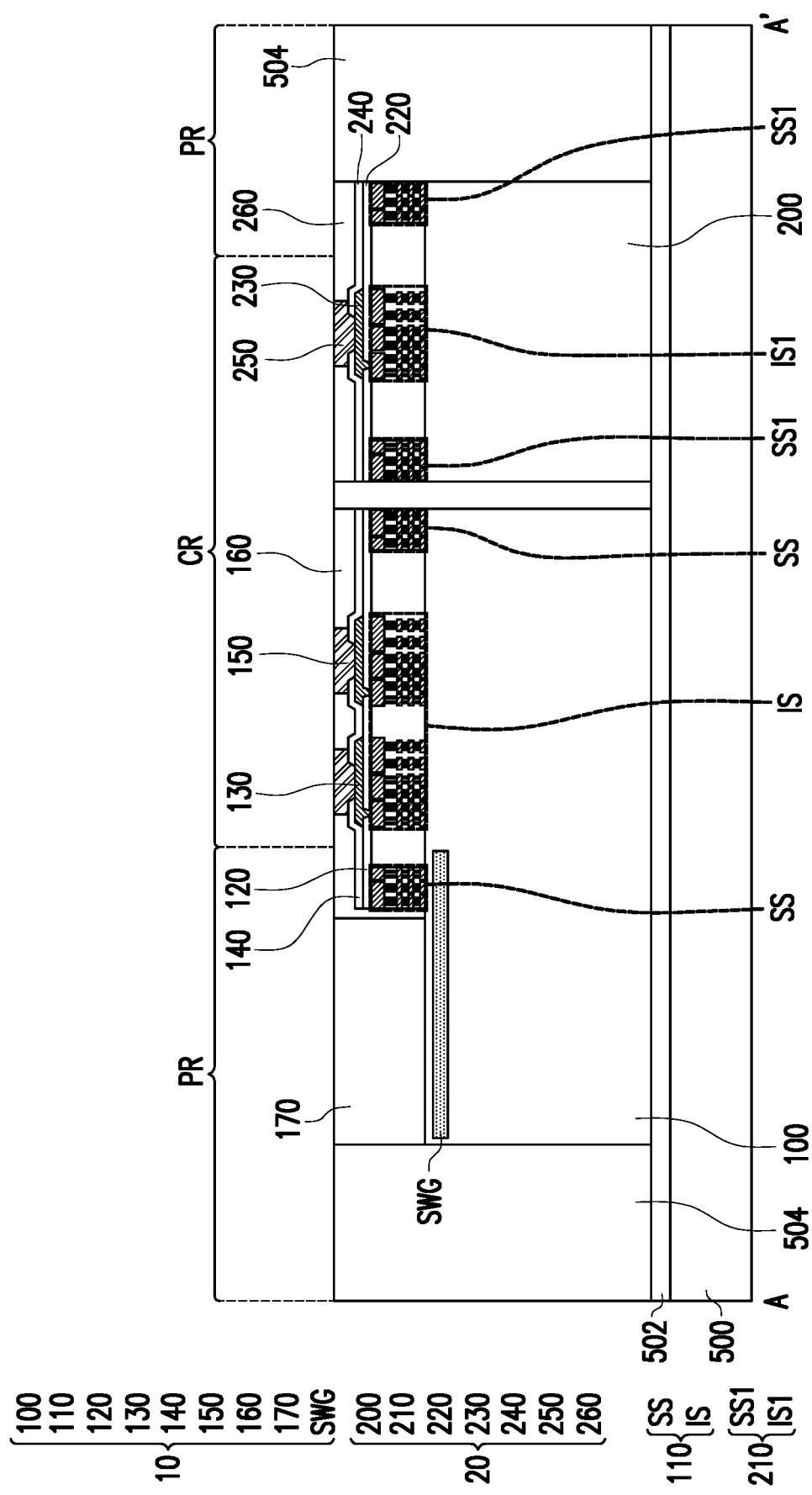

Referring to FIG. 4C, a portion of the insulating material 504a, a portion of the sacrificial layer 170, a portion of the protection layer 160, and a portion of the protection layer 260 are removed to expose the conductive posts 150 of the photonic integrated circuit 10 and the conductive posts 250 of the electric integrated circuit 20. In some embodiments, the portion of the insulating material 504a, the portion of the sacrificial layer 170, the portion of the protection layer 160, and the portion of the protection layer 260 are removed through a grinding process, such as a mechanical grinding process, a CMP process, or another suitable mechanism. After the insulating material 504a is grinded, an encapsulant 504 is formed over the carrier 500 and the adhesive layer 500 to laterally encapsulate the photonic integrated circuit 10 and the electric integrated circuit 20. After grinding, a top surface of the sacrificial layer 170, a top surface of the protection layer 160, top surfaces of the conductive posts 150, a top surface of the encapsulant 504, a top surface of the protection layer 260, and top surfaces of the conductive posts 250 are substantially coplanar.

Figure 4D:
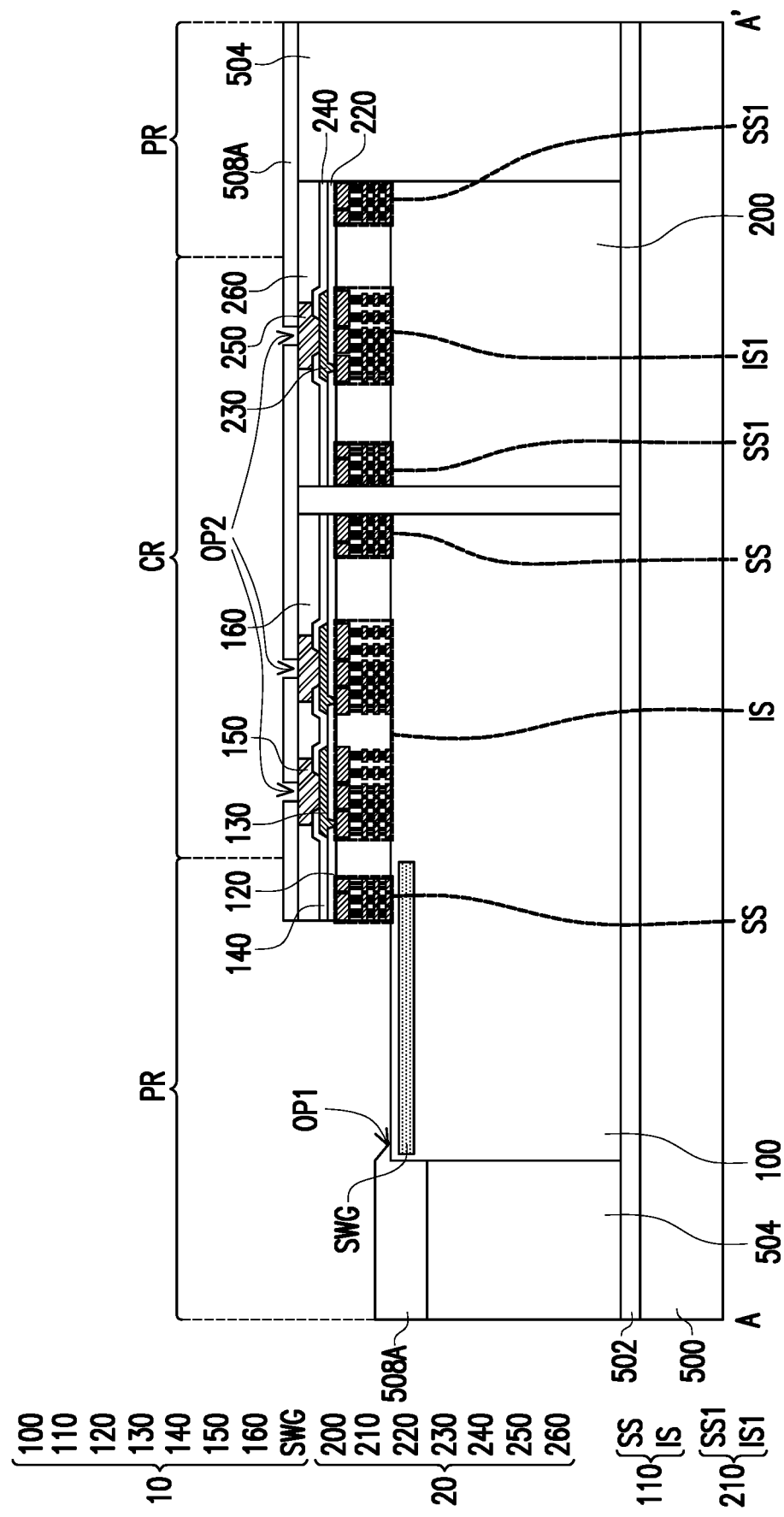

Referring to FIG. 4D, the sacrificial layer 170 is removed. Meanwhile, a portion of the encapsulant 504 that is next to the sacrificial layer 170 is also removed. Upon removal of the sacrificial layer 170 and the portion of the encapsulant 504, the region of the substrate 100 that corresponds to the silicon waveguides SWG is exposed. Thereafter, a dielectric layer 508A is formed on the encapsulant 504, the photonic integrated circuit 10, and the electric integrated circuit 20. As illustrated in FIG. 4D, a portion of the dielectric layer 508A and the interconnection layer 110 together define an opening OP1 exposing the region of the substrate 100 that corresponds to the silicon waveguides SWG. In some embodiments, the dielectric layer 508A also includes a plurality of contact openings OP2. In some embodiments, the contact openings OP2 correspond to and expose the conductive posts 150 of the photonic integrated circuit 10 and the conductive posts 250 of the electric integrated circuit 20, so as to render electrical connection between the photonic integrated circuit 10, the electric integrated circuit 20, and the subsequently formed conductive materials. In some embodiments, a material of the dielectric layer 508A includes polyimide, epoxy resin, acrylic resin, phenol resin, BCB, PBO, or any other suitable polymer-based dielectric material. The dielectric layer 508A, for example, may be formed by suitable fabrication techniques, such as spin-on coating, CVD, PECVD, or the like.

Figure 4E:
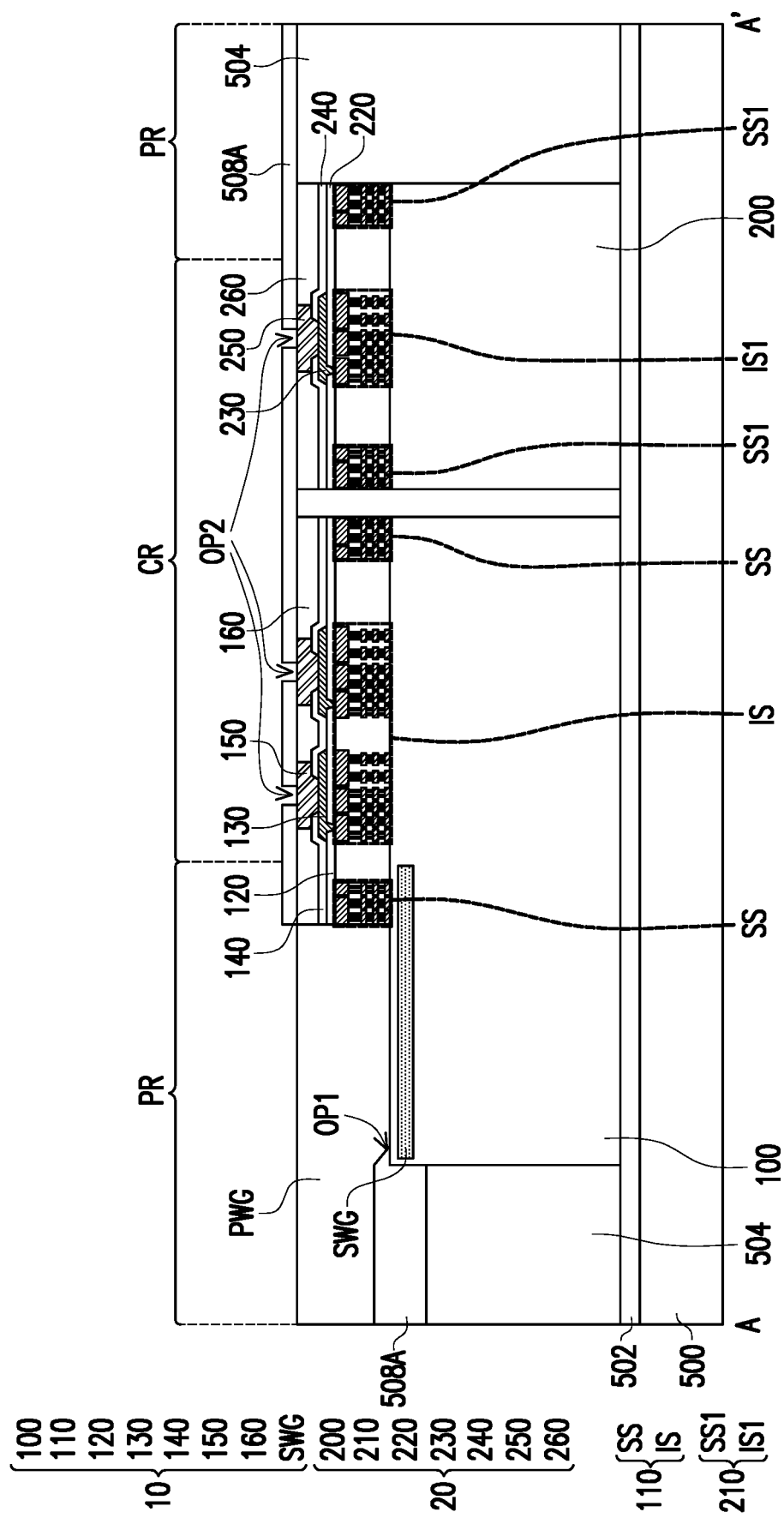

Referring to FIG. 4E, a plurality of polymer waveguides PWG is formed over the photonic integrated circuit 10. For example, the polymer waveguides PWG are disposed on a portion of the dielectric layer 508A and the substrate 100. In some embodiments, the polymer waveguides PWG fills the opening OP1 such that the polymer waveguides PWG overlap the silicon waveguides SWG and is adjacent to the seal ring structure SS of the photonic integrated circuit 10. As illustrated in FIG. 4E, a portion of the dielectric layer 508A is sandwiched between the polymer waveguides PWG and the encapsulant 504. In some embodiments, the polymer waveguides PWG are in optical alignment with the silicon waveguides SWG such that optical signals outputted/inputted from/to the silicon waveguides SWG are optically coupled to/from the polymer waveguides PWG. The polymer waveguides PWG includes a combination of polymer materials, such as poly(methylmethacrylate) (PMMA), polystyrene (PS), polycarbonate, polyurethane, benzocyclobutane, perfluorovinyl ether cyclopolymer, tetrafluoroethylene, perfluorovinyl ether copolymer, silicone, fluorinated poly(arylene) ether sulfide, poly(pentafluorostyrene), fluorinated dendrimers, fluorinated hyperbranched polymers, or the like. The relative configuration of the polymer waveguide PWG with respect to other elements in the package structure PS will be described later in conjunction with FIG. 5.

Figure 4F:
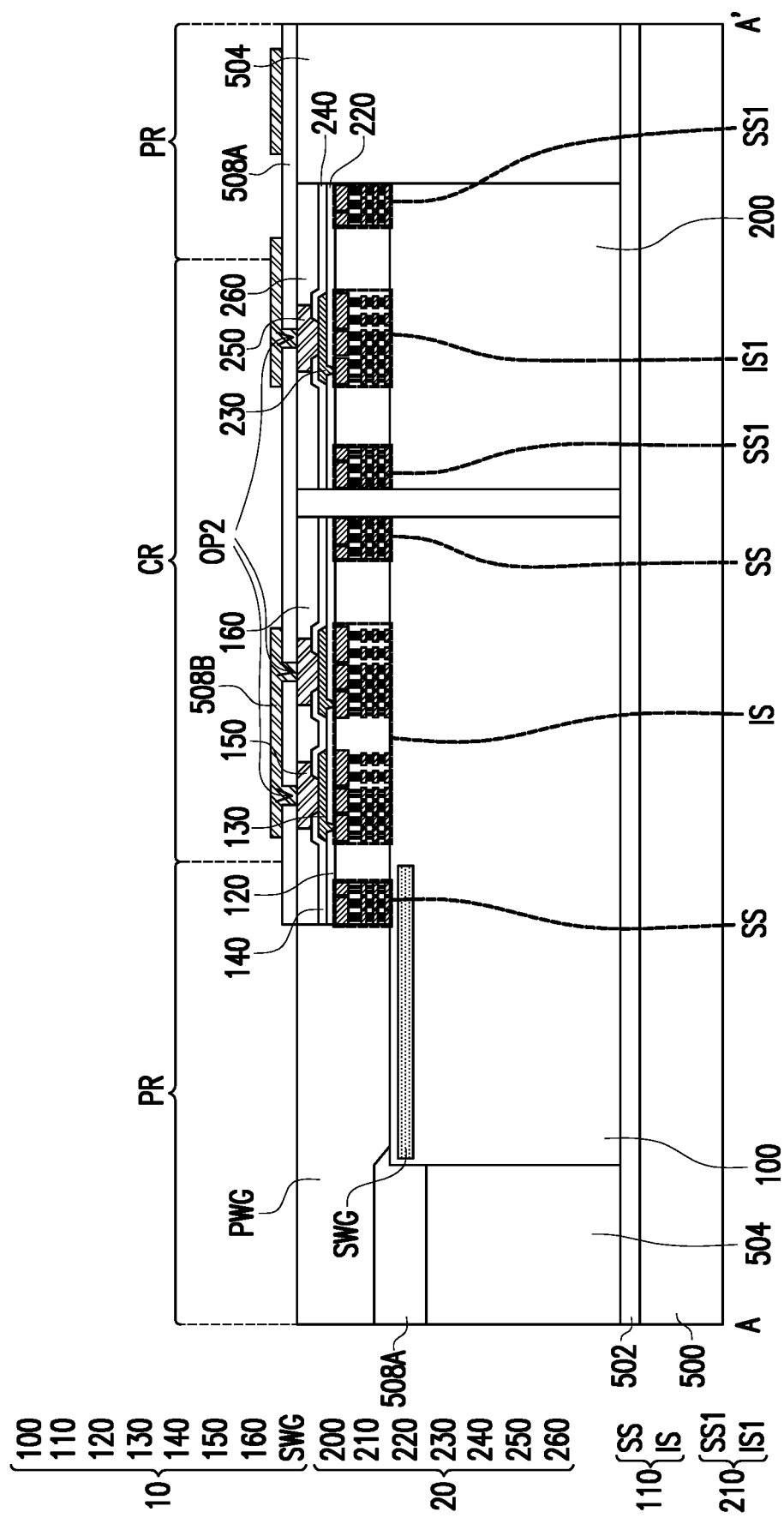

Referring to FIG. 4F, a plurality of conductive patterns 508B is formed on the dielectric layer 508A. In some embodiments, the conductive pattern 508B is formed by the following steps. First, a seed layer (not shown) is conformally formed on the photonic integrated circuit 10 and the electric integrated circuit 20. For example, at least a portion of the seed layer extends into the contact openings OP2 to be in physical with the conductive posts 150 and the conductive posts 250. The seed layer may be formed through a sputtering process, a PVD process, or the like. In some embodiments, the seed layer is constituted by two sub-layers (not shown). The first sub-layer may include titanium, titanium nitride, tantalum, tantalum nitride, other suitable materials, or a combination thereof. On the other hand, the second sub-layer may include copper, copper alloys, or other suitable choice of materials. Subsequently, a patterned photoresist layer is formed over the seed layer. In some embodiments, the patterned photoresist layer is made of a photosensitive material. In some embodiments, the patterned photoresist layer has a plurality of openings (not shown) partially exposing the seed layer above the conductive posts 150 and the conductive posts 250. For example, the openings expose the seed layer located directly above the conductive posts 150 and the conductive posts 250. Then, a conductive material (not shown) is filled into the openings of the patterned photoresist layer. In some embodiments, the conductive material is made of aluminum, nickel, titanium, copper, tungsten, and/or alloys thereof. The conductive material is formed through a plating process. The plating process is, for example, an electro-plating process, an electroless-plating process, an immersion plating process, or the like. Afterwards, the patterned photoresist layer is removed. The patterned photoresist layer may be removed through an etching process, a stripping process, an ashing process, a combination thereof, or the like. Thereafter, by using the conductive material as a hard mask, the seed layer that is uncovered by the conductive material is removed. In some embodiments, portions of the seed layer are removed through an etching process. The remaining seed layer and the conductive material collectively form the conductive patterns 508B.

Figure 4G:
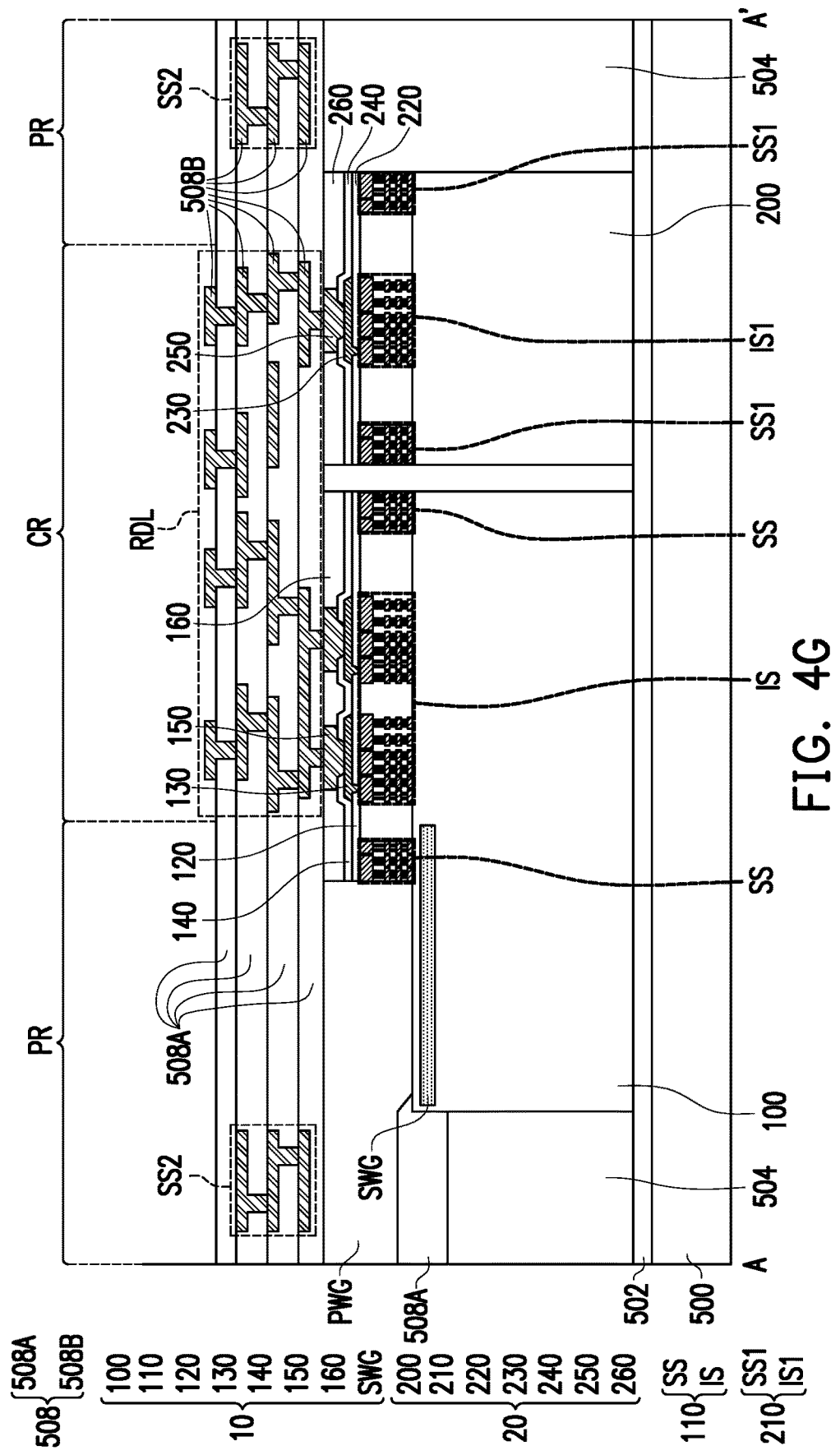

Referring to FIG. 4G, the steps illustrated in FIGS. 4D and 4F are repeated several times to render a redistribution layer 508. That is, the redistribution layer 508 is disposed on the polymer waveguide PWG, the photonic integrated circuit 10, the electric integrated circuit 20, and the encapsulant 504. In some embodiments, the redistribution layer 508 includes a plurality of dielectric layers 508A and a plurality of conductive patterns 508B. As illustrated in FIG. 4G, the dielectric layer 508A and the conductive patterns 508B are alternately stacked. Meanwhile, the conductive patterns 508B are connected to one another through conductive vias therebetween.

In some embodiments, the redistribution layer 508 includes a redistribution structure RDL located in the central region CR and a seal ring structure SS2 located in the peripheral region PR. That is, the seal ring structure SS2 surrounds the redistribution structure RDL. In some embodiments, the redistribution structure 508 RDL is electrically connected to the conductive posts 150 of the photonic integrated circuit 10 and the conductive posts 250 of the electric integrated circuit 20. For example, the bottommost conductive pattern 508B of the redistribution structure RDL is in physical contact with the conductive posts 150 and the conductive posts 250 to render electrical connection with these elements. That is, the redistribution structure RDL is electrically connected to the photonic integrated circuit 10 and the electric integrated circuit 20. In some embodiments, the topmost conductive patterns 508B are referred to as under-ball metallurgy (UBM) patterns for ball mount. In some embodiments, the redistribution structure RDL and the seal ring structure SS2 are simultaneously formed. In some embodiments, the seal ring structure SS2 is electrically floating. The detailed configuration of the seal ring structure SS2 with respect to other elements in the package structure PS will be described later in conjunction with FIG. 5.

Figure 4H:
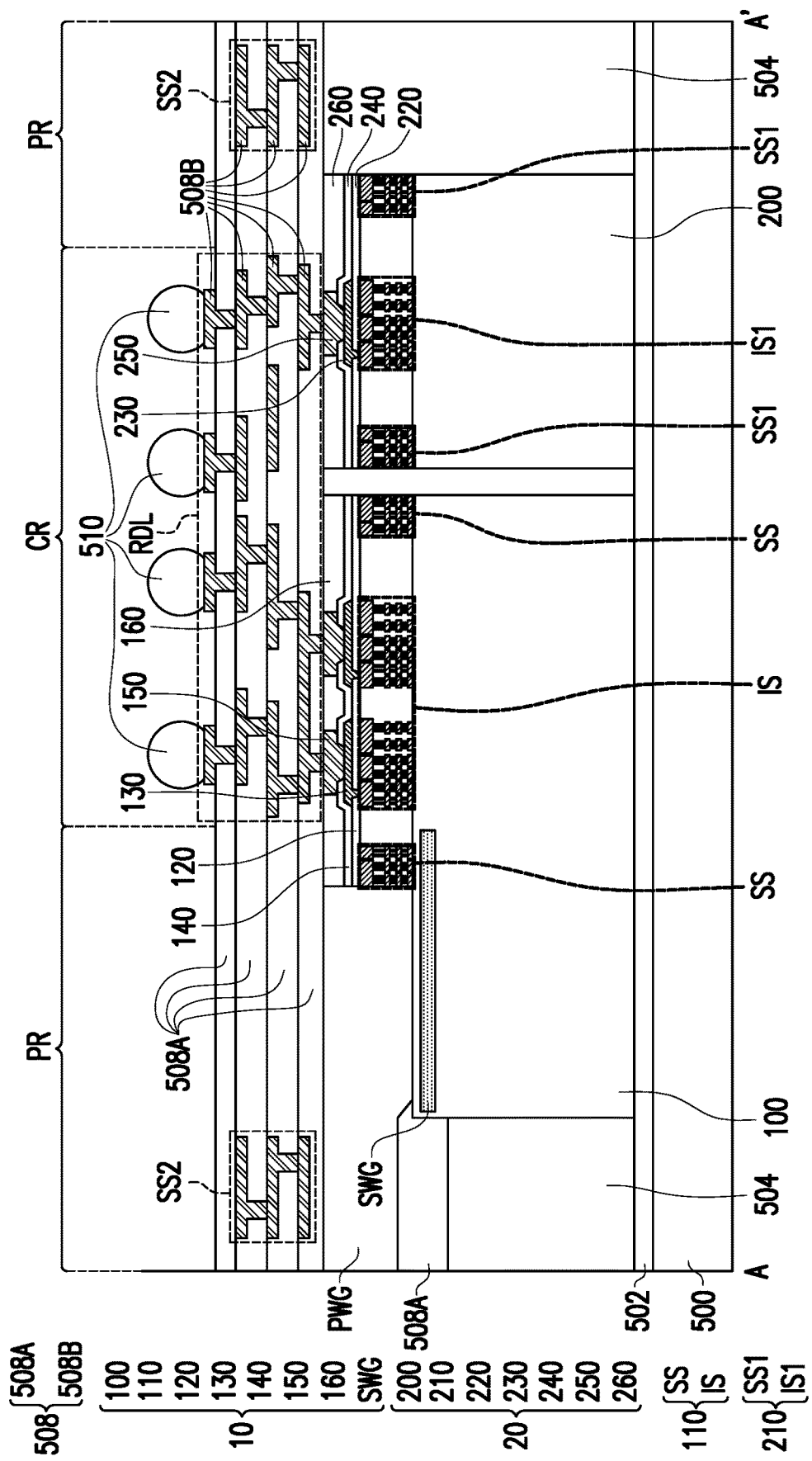

Referring to FIG. 4H, a plurality of conductive terminals 510 are placed on the redistribution structure RDL of the redistribution layer 508. For example, the conductive terminals 510 are disposed on the UBM patterns. In some embodiments, the conductive terminals 510 are attached to the UBM patterns through a solder flux. In some embodiments, the conductive terminals 510 are solder balls, ball grid array (BGA) balls, or the like. In some embodiments, the conductive terminals 510 are made of a conductive material with low resistivity, such as Sn, Pb, Ag, Cu, Ni, Bi, or an alloy thereof. In some embodiments, the conductive terminals 510 are placed on the under-UBM patterns through a ball placement process or other suitable processes or other suitable processes.

Figure 4I:
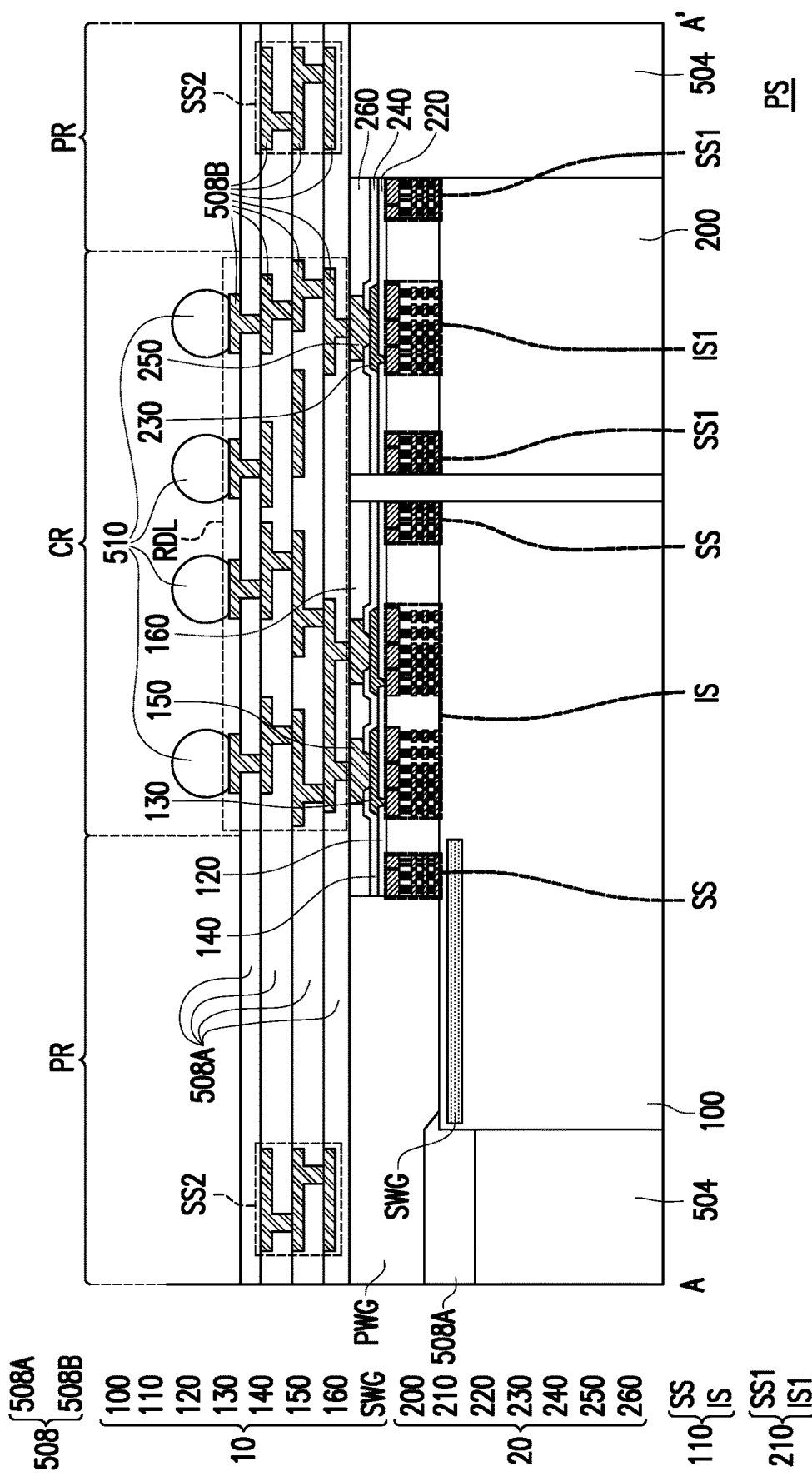

Referring to FIG. 4I, after the conductive terminals 510 are mounted on the redistribution layer 508, the carrier 500 and the de-bonding layer (not shown) are removed from the photonic integrated circuit 10, the electric integrated circuit 20, and the encapsulant 504. In some embodiments, the de-bonding layer DB (e.g., the LTHC release layer) may be irradiated by an UV laser such that the carrier 500 and the de-bonding layer may be peeled off from the photonic integrated circuit 10, the electric integrated circuit 20, and the encapsulant 504. Thereafter, the adhesive layer 502 may be removed through a stripping process, an etching process, or the like to obtain the package structure PS. It should be noted that the removal of the adhesive layer 502 is optional. In some alternative embodiments, the adhesive layer 502 remains in the package structure PS.

As mentioned above, FIG. 5 is a schematic top view illustrating the package structure PS in FIG. 4I. It should be noted that for simplicity, elements other than the seal ring structure SS of the photonic integrated circuit 10, the seal ring structure SS1 of the electric integrated circuit 20, the seal ring structure SS2 of the package structure PS, the silicon waveguide SWG, and the polymer waveguide PWG are omitted in the top view of FIG. 5. As mentioned above, the seal ring SS of the photonic integrated circuit 10 has the recess R from the top view. Moreover, the seal ring SS is divided into the first segment S1, the second segment S2, the third segment S3, and the fourth segment S4. The first segment S1 is further divided into the first sub-segment S1A, the second sub-segment S1B, the third sub-segment S1C, the fourth sub-segment S1D, and the fifth sub-segment S1E. As illustrated in FIG. 5, the polymer waveguides PWG are overlapped with the corresponding silicon waveguide SWG from the top view. As mentioned above, the silicon waveguides SWG are partially located in the recess R. As such, the polymer waveguides PWG are also located within the recess R of the seal ring structure SS of the photonic integrated circuit 10 from the top view. For example, as illustrated in FIG. 5, multiple polymer waveguides PWG are partially located within the same recess R. However, the disclosure is not limited thereto. In an embodiments in which the seal ring structure SS has multiple recesses (i.e. the seal ring structure SS' shown in FIG. 3B), each recess R may accommodate one single polymer waveguide PWG from the top view. In some embodiments, the polymer waveguides PWG are parallel to the silicon waveguides SWG. In other words, the polymer waveguides PWG are also parallel to the second sub-segment S1B, the fourth sub-segment S1D, the second segment S2, and the fourth segment S4. On the other hand, the polymer waveguides PWG are perpendicular to the first sub-segment S1A, the third sub-segment S1C, the fifth sub-segment S1E, and the third segment S3. Under this configuration, the seal ring structure SS is able to protect the photonic integrated circuit 10 from stress during sawing operation while enabling the silicon waveguides SWG to exchange optical signals with the polymer waveguides PWG through edge-coupling.

As illustrated in FIG. 5, the seal ring structure SS2 extends along four edges of the package structure PS and encloses the seal ring SS of the photonic integrated circuit 10 and the seal ring structure SS1 of the electric integrated circuit 20. In some embodiments, the seal ring structure SS2 intersects the polymer waveguides PWG from the top view. That is, the polymer waveguides PWG extend beyond the package structure PS, so as to optically couple the package structure PS with other external components.

Figure 6:
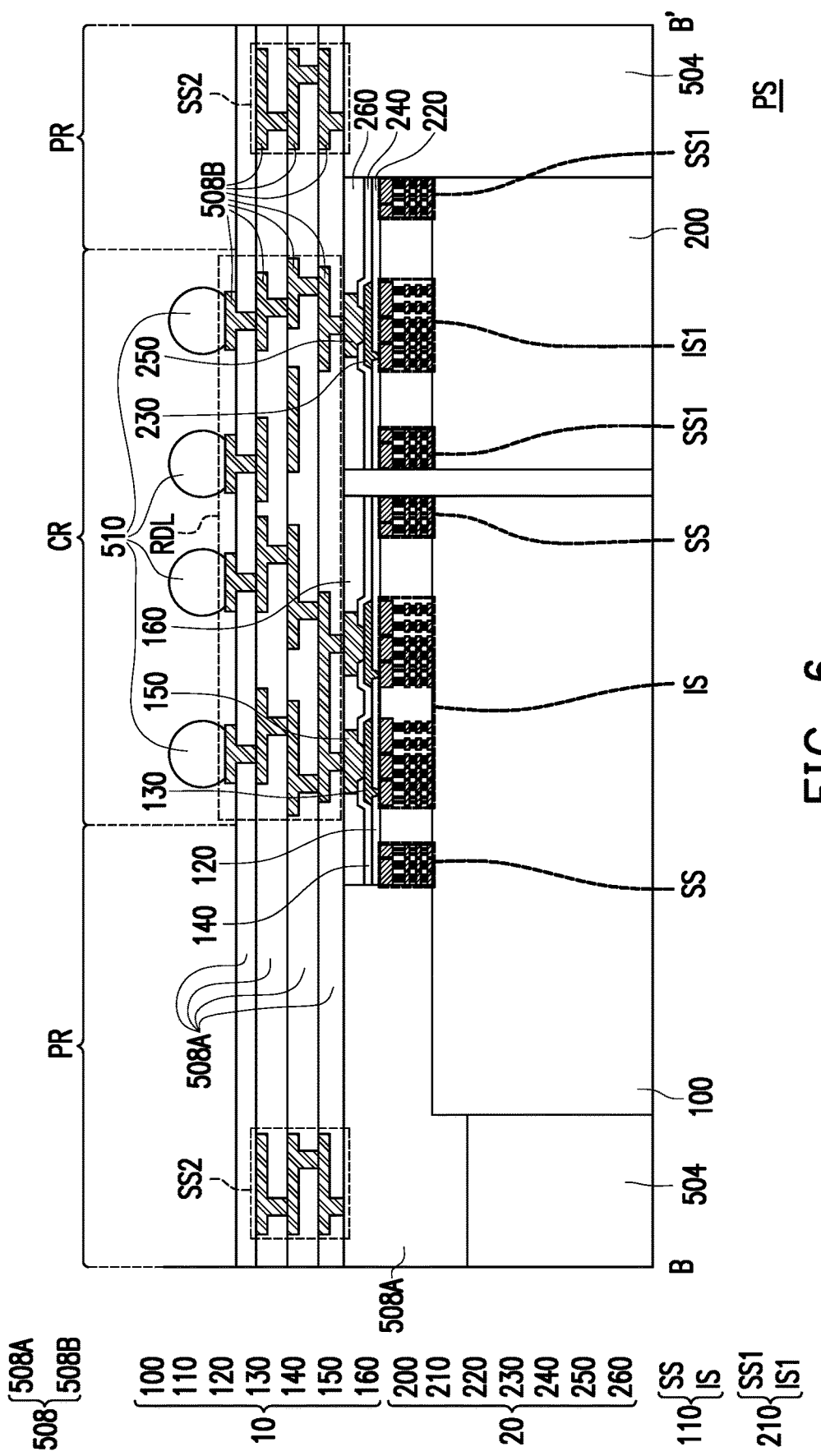
FIG. 6 is a schematic cross-sectional view illustrating the package structure along cross-sectional line B-B' in FIG. 5.

FIG. 6 is a schematic cross-sectional view illustrating the package structure PS along cross-sectional line B-B' in FIG. 5. Referring to FIG. 6, the bottommost dielectric layer 508A is thicker than the rest of the dielectric layers 508A. In other words, the polymer waveguides PWG shown in the cross-sectional view of FIG. 4I is laterally surrounded by the bottommost dielectric layer 508A shown in FIG. 6.

A photonic integrated circuit includes a substrate, an interconnection layer, and a plurality of silicon waveguides. The interconnection layer is over the substrate. The interconnection layer includes a seal ring structure and an interconnection structure surrounded by the seal ring structure. The seal ring structure has at least one recess from a top view. The recess concaves towards the interconnection structure. The silicon waveguides are embedded in the substrate.

A package structure having a central region and a peripheral region surrounding the central region includes an electric integrated circuit, a photonic integrated circuit, an encapsulant, a redistribution layer, and a plurality of polymer waveguides. The photonic integrated circuit is adjacent to the electric integrated circuit. The photonic integrated circuit includes a first seal ring structure and a plurality of silicon waveguides underneath the first seal ring structure, and the first seal ring structure includes at least one recess from a top view. The encapsulant encapsulates the electric integrated circuit and the photonic integrated circuit. The redistribution layer is disposed on the electric integrated circuit, the photonic integrated circuit, and the encapsulant. The redistribution layer includes a redistribution structure located in the central region and a second seal ring located in the peripheral region. The polymer waveguides are disposed on the photonic integrated circuit and are optically coupled to the plurality of silicon waveguides.

A package structure having a central region and a peripheral region surrounding the active region includes a photonic integrated circuit, an encapsulant, a redistribution layer, and a plurality of polymer waveguides. The photonic integrated circuit includes a first seal ring structure and a plurality of silicon waveguides underneath the first seal ring structure. The first seal ring structure includes a first segment, a second segment, a third segment, and a fourth segment, the third segment is connected to the second segment and the fourth segment, and the second segment and the fourth segment are connected to the first segment. The first segment includes a first sub-segment, a second sub-segment, and a third sub-segment, the first sub-segment is connected to the second segment and the second sub-segment, and the second sub-segment is connected to the first sub-segment and the third sub-segment, the first sub-segment and the third sub-segment are parallel to the third segment, and the second sub-segment is parallel to the second segment and the fourth segment. The encapsulant encapsulates the photonic integrated circuit. The redistribution layer is disposed on the photonic integrated circuit and the encapsulant. The redistribution layer includes a redistribution structure located in the central region and a second seal ring located in the peripheral region. The polymer waveguides are disposed on the photonic integrated circuit and are optically coupled to the plurality of silicon waveguides.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A photonic integrated circuit, comprising:
   a substrate comprising a top layer made of a semiconductor material;

an interconnection layer over the substrate, wherein the interconnection layer comprises a seal ring structure and an interconnection structure surrounded by the seal ring structure, the seal ring structure has at least one recess from a top view, the recess concaves towards the interconnection structure, and the seal ring structure is a continuous structure from the top view; and a plurality of silicon waveguides embedded in the top layer of the substrate.

2. The photonic integrated circuit of claim 1, wherein at least a portion of each of the plurality of silicon waveguides is located within the at least one recess from the top view.

3. The photonic integrated circuit of claim 1, wherein the plurality of silicon waveguides intersect a portion of the seal ring structure from the top view.

4. The photonic integrated circuit of claim 1, wherein the at least one recess of the seal ring structure comprises a plurality of recesses, and the seal ring structure exhibits a comb shape from the top view.

5. The photonic integrated circuit of claim 1, wherein the seal ring structure is electrically floating.

6. The photonic integrated circuit of claim 1, wherein an area enclosed by the seal ring structure is approximately 80% to approximately 99% of a total area of a top surface of the photonic integrated circuit.

7. A package structure having a central region and a peripheral region surrounding the central region, comprising:

an electric integrated circuit;

a photonic integrated circuit adjacent to the electric integrated circuit, wherein the photonic integrated circuit comprises a first seal ring structure and a plurality of silicon waveguides underneath the first seal ring structure, and the first seal ring structure comprises at least one recess from a top view;

an encapsulant encapsulating the electric integrated circuit and the photonic integrated circuit;

a redistribution layer disposed on the electric integrated circuit, the photonic integrated circuit, and the encapsulant, wherein the redistribution layer comprises a redistribution structure located in the central region and a second seal ring structure located in the peripheral region; and a plurality of polymer waveguides disposed on the photonic integrated circuit and optically coupled to the plurality of silicon waveguides.

8. The package structure of to claim 7, wherein the first seal ring structure and the second seal ring structure are electrically floating, and the redistribution structure is electrically connected to the photonic integrated circuit and the electric integrated circuit.

9. The package structure of claim 7, wherein the second seal ring structure extends along four edges of the package structure from the top view.

10. The package structure of claim 7, wherein the plurality of polymeric waveguides are located within the at least one recess from the top view.

11. The package structure of claim 7, wherein the at least one recess of the first seal ring structure comprises a plurality of recesses, and each of the plurality of recesses accommodates one of the plurality of polymer waveguides from the top view.

12. The package structure of claim 7, wherein the second seal ring structure intersects the plurality of polymer waveguides from the top view.

13. The package structure of claim 7, further comprising a dielectric layer sandwiched between the plurality of polymer waveguides and the encapsulant.

14. A package structure having a central region and a peripheral region surrounding the central region, comprising:

a photonic integrated circuit, wherein the photonic integrated circuit comprises a first seal ring structure and a plurality of silicon waveguides underneath the first seal ring structure, and the first seal ring structure comprises a first segment, a second segment, a third segment, and a fourth segment, the third segment is connected to the second segment and the fourth segment, and the second segment and the fourth segment are connected to the first segment, the first segment comprises a first sub-segment, a second sub-segment, and a third sub-segment, the first sub-segment is connected to the second segment and the second sub-segment, and the second sub-segment is connected to the first sub-segment and the third sub-segment, the first sub-segment and the third sub-segment are parallel to the third segment, and the second sub-segment is parallel to the second segment and the fourth segment;

an encapsulant encapsulating the photonic integrated circuit;

a redistribution layer disposed on the photonic integrated circuit and the encapsulant, wherein the redistribution layer comprises a redistribution structure located in the central region and a second seal ring located in the peripheral region; and a plurality of polymer waveguides disposed on the photonic integrated circuit and optically coupled to the plurality of silicon waveguides.

15. The package structure of claim 14, wherein the second segment, the third segment, and the fourth segment respectively extend along three edges of the photonic integrated circuit.

16. The package structure of claim 14, wherein the second sub-segment is perpendicular to the first sub-segment and the third sub-segment.

17. The package structure of claim 14, wherein the first segment further comprises a fourth sub-segment and a fifth sub-segment, the fourth sub-segment is connected to the third sub-segment and the fifth sub-segment, the fifth sub-segment is connected to the fourth segment, the fourth sub-segment is parallel to the second sub-segment, and the fifth sub-segment is parallel to the first sub-segment and the third sub-segment.

18. The package structure of claim 14, wherein the plurality of silicon waveguides are parallel to the second sub-segment and the fourth sub-segment.

19. The package structure of claim 14, wherein the plurality of polymer waveguides are parallel to the second sub-segment and the fourth sub-segment.

20. The package structure of claim 14, wherein the plurality of silicon waveguides are located underneath the third-sub segment of the first seal ring.

* * * * *